(12) United States Patent
Miyairi

(10) Patent No.: US 8,053,333 B2
(45) Date of Patent: Nov. 8, 2011

(54) MANUFACTURING METHOD OF SEMICONDUCTOR DEVICE

(75) Inventor: Hidekazu Miyairi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 60 days.

(21) Appl. No.: 12/781,873

(22) Filed: May 18, 2010

(65) Prior Publication Data

US 2010/0221858 A1 Sep. 2, 2010

Related U.S. Application Data

(62) Division of application No. 12/153,644, filed on May 22, 2008, now Pat. No. 7,745,268.

(30) Foreign Application Priority Data

Jun. 1, 2007 (JP) ................................ 2007-146540

(51) Int. Cl.
*H01L 27/01* (2006.01)

(52) U.S. Cl. .. 438/458; 438/455; 438/795; 257/E21.599

(58) Field of Classification Search .................. 438/455, 438/458, 486–488, 795; 257/E21.599
See application file for complete search history.

(56) References Cited

U.S. PATENT DOCUMENTS

| | | | |
|---|---|---|---|
| 5,643,826 A | 7/1997 | Ohtani et al. | |
| 5,923,962 A | 7/1999 | Ohtani et al. | |
| 6,285,042 B1 | 9/2001 | Ohtani et al. | |
| 6,335,541 B1 | 1/2002 | Ohtani et al. | |
| 6,677,222 B1 | 1/2004 | Mishima et al. | |
| 6,803,296 B2 | 10/2004 | Miyairi | |
| 6,998,639 B2 | 2/2006 | Ohtani et al. | |
| 7,119,365 B2 | 10/2006 | Takafuji et al. | |
| 7,253,032 B2 | 8/2007 | Yamazaki et al. | |
| 7,579,654 B2 | 8/2009 | Couillard et al. | |
| 7,714,251 B2 | 5/2010 | Miyairi | |
| 2003/0183876 A1* | 10/2003 | Takafuji et al. | 257/347 |
| 2006/0131583 A1 | 6/2006 | Ohtani et al. | |
| 2007/0117288 A1* | 5/2007 | Miyairi | 438/151 |
| 2007/0281172 A1* | 12/2007 | Couillard et al. | 428/446 |

FOREIGN PATENT DOCUMENTS

| | | |
|---|---|---|
| EP | 0 651 431 | 5/1995 |
| EP | 1 158 580 | 11/2001 |
| JP | 61142738 A * | 6/1986 |
| JP | 03252393 A * | 11/1991 |
| JP | 07-130652 | 5/1995 |
| JP | 11-163363 | 6/1999 |
| JP | 2005-252244 | 9/2005 |

OTHER PUBLICATIONS

Zehner et al., "Preparation of atomically clean silicon surfaces by pulsed laser irradiation", Applied Physics Letters vol. 36, No. 1 (1980): pp. 56-59.*

Zehner et al., "Preparation of atomically clean silicon surfaces by pulsed laser irradiation," Applied Physics Letters, vol. 36, No. 1, Jan. 1, 1980, pp. 56-59.

* cited by examiner

*Primary Examiner* — Jarrett Stark
*Assistant Examiner* — Michele Fan
(74) *Attorney, Agent, or Firm* — Eric J. Robinson; Robinson Intellectual Law Office, P.C.

(57) ABSTRACT

To provide a semiconductor device with high performance and low cost and a manufacturing method thereof. A first region including a separated (cleavage) single-crystal semiconductor layer and a second region including a non-single-crystal semiconductor layer are provided over a substrate. It is preferable that laser beam irradiation be performed to the separated (cleavage) single-crystal semiconductor layer in an inert atmosphere, and laser beam irradiation be performed to the non-single-crystal semiconductor layer in an air atmosphere at least once.

19 Claims, 17 Drawing Sheets

MANUFACTURING METHOD OF SEMICONDUCTOR DEVICE

BACKGROUND OF THE INVENTION

1. Field of the Invention

The present invention relates to a semiconductor device and a manufacturing method thereof.

2. Description of the Related Art

The history of developing semiconductor devices having transistors using semiconductors has been a history of the challenge of providing higher performance semiconductor devices at lower cost.

One of methods for improving the performance of semiconductor devices is to improve crystallinity of a semiconductor.

Single-crystal semiconductors have the highest crystallinity.

Single-crystal semiconductor wafers, SOI (silicon on insulator) substrates, and the like are given as substrates for single-crystal semiconductors.

However, such substrates have a disadvantage of high cost. This disadvantage is more significant as the substrates have larger area.

On the other hand, semiconductor devices using semiconductors formed on low-cost substrates (e.g., glass substrates) by a film formation method are given as low-cost semiconductor devices in which larger substrates are suitably used.

Further, regarding a semiconductor device using a semiconductor formed on a substrate by a film formation method, there have been attempts to provide higher performance semiconductor devices at low cost, in which crystallinity of a semiconductor is improved (for example, Reference 1: Japanese Published Patent Application No. 117-130652).

However, it is very difficult to make a perfect single-crystal semiconductor from a semiconductor formed on a substrate by a film formation method.

In response, there have also been attempts to form a single-crystal semiconductor on a low-cost substrate by bonding a single-crystal semiconductor onto a low-cost substrate (Reference 2: Japanese Published Patent Application No. 1111-163363).

However, the techniques disclosed in Patent Document 1 and Patent Document 2 have a problem of damaging a single crystal due to implantation of ion species of hydrogen or the like and a problem of generating large projections and depressions on a surface of a single crystal which remains over a base substrate.

When a gate insulating film is formed, the large projections and depressions penetrate the gate insulating film, causing a problem of leakage between the semiconductor layer and a gate electrode.

With the invention disclosed in Reference 2, high performance semiconductor devices can be provided at low cost; however, since a single-crystal semiconductor is used, the cost is higher compared with the cost involved in the case of using the invention disclosed in Reference 1.

Here, a semiconductor device has various circuits, and there are cases where not all the circuits are necessarily formed using a single crystal, but only some high performance circuits should be formed using a single crystal.

SUMMARY OF THE INVENTION

In view of the above problems, it is an object of the present invention to provide a low-cost high performance semiconductor device and a manufacturing method thereof.

A semiconductor device of the present invention includes a first region including a separated (cleavage) single-crystal semiconductor layer and a second region including a non-single-crystal semiconductor layer, over a substrate.

Further, circuits required to achieve high performance (high crystallinity, less variation in performance of semiconductor elements in the substrate surface, or the like) are disposed in the first region, and circuits which are not necessarily required to achieve such high performance are disposed in the second region.

Here, a separated (cleavage) single-crystal semiconductor layer refers to a semiconductor layer obtained through the following steps: ion species composed of one or more atoms of hydrogen, helium, and halogen are introduced into a single-crystal semiconductor substrate by implantation or doping; an ion layer is formed in a region at a predetermined depth from a surface of the single-crystal semiconductor substrate; a bond layer is formed over the surface of the single-crystal semiconductor substrate; the bond layer is bonded to a substrate; and energy is applied to the single-crystal semiconductor substrate so that a crack is generated in the ion layer and thus the semiconductor layer remains on the substrate.

Note that in this specification, "to implant ion species" means to introduce a source gas containing ion species which have been mass-separated, into an object. On the other hand, "doping with ion species" means to introduce a source gas containing ion species which have not been mass-separated, into an object. Further, since an ion doping apparatus is not required to have a mass separator, it is less expensive as compared with an ion implanter. Since the cost in the case of using doping can be lower, doping is preferably used to introduce ion species.

It is preferable that a laser beam be used to recovery damage of a separated (cleavage) single-crystal semiconductor layer and to crystallize a non-single-crystal semiconductor layer.

It is particularly preferable to use a pulsed laser beam of an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, a gold vapor laser, or the like because the width of the laser beam can be increased so that time for irradiation with a laser beam can be shortened.

From the experimental results, the present inventor has found that there is the following tendency when a pulsed laser beam is used.

According to the results of the experiment conducted by the present inventor, when a non-single-crystal semiconductor layer or a separated (cleavage) single-crystal semiconductor layer is irradiated with a pulsed laser beam, flatness of the surface is better in the case of irradiation with a pulsed laser beam in an inert atmosphere, compared to the case of irradiation with a pulsed laser beam in an air atmosphere.

The inert atmosphere is an atmosphere with a low oxygen concentration, and for example, a nitrogen atmosphere, a rare gas atmosphere, and the like can be given.

Accordingly, by irradiation of a separated (cleavage) single-crystal semiconductor layer with a laser beam in an inert atmosphere, recovery of damage which is caused by implantation or doping with ion species and improvement in flatness can be both achieved.

On the other hand, according to the results of the experiment conducted by the present inventor, when a non-single-crystal semiconductor layer is irradiated with a laser beam to be crystallized, device characteristics are better in the case of irradiation with a laser beam in an air atmosphere, compared to the case of irradiation with a laser beam in an inert atmosphere.

This is because when the non-single-crystal semiconductor layer is crystallized by a laser beam, oxygen in the air atmosphere compensates a large number of crystal defects included in the non-single-crystal semiconductor layer.

Note that since the separated (cleavage) single-crystal semiconductor layer has a much smaller number of crystal defects compared to that of the non-single-crystal semiconductor layer, the dependence of characteristics of the separated (cleavage) single-crystal semiconductor layer on the atmosphere is small.

Further, in the case of irradiating a non-single-crystal semiconductor layer with a laser beam plural times, irradiation with a laser beam in an air atmosphere at least one time can improve device characteristics by the effect of oxygen.

Accordingly, one feature of a manufacturing method of a semiconductor device of the present invention is to irradiate a separated (cleavage) single-crystal semiconductor layer with a laser beam in an inert atmosphere and to irradiate a non-single-crystal semiconductor layer with a laser beam in an air atmosphere at least one time.

One feature of a manufacturing method of a semiconductor device of the present invention is to form a first region including a separated (cleavage) single-crystal semiconductor layer and a second region including a non-single-crystal semiconductor layer over a substrate, and to perform a step of irradiating the separated (cleavage) single-crystal semiconductor layer with a laser beam in an inert atmosphere and a step of irradiating the non-single-crystal semiconductor layer with a laser beam in an air atmosphere.

Another feature of a manufacturing method of a semiconductor device of the present invention is to form a first region including a separated (cleavage) single-crystal semiconductor layer and a second region including a non-single-crystal semiconductor layer over a substrate, to irradiate the non-single-crystal semiconductor layer with a first laser beam in an air atmosphere, and to irradiate the non-single-crystal semiconductor layer and the separated (cleavage) single-crystal semiconductor layer with a second laser beam in an inert atmosphere.

Another feature of a manufacturing method of a semiconductor device of the present invention is to form a first region including a separated (cleavage) single-crystal semiconductor layer and a second region including a non-single-crystal semiconductor layer over a substrate, to irradiate the non-single-crystal semiconductor layer and the separated (cleavage) single-crystal semiconductor layer with a first laser beam in an air atmosphere, and to irradiate the non-single-crystal semiconductor layer and the separated (cleavage) single-crystal semiconductor layer with a second laser beam in an inert atmosphere.

Still another feature of a manufacturing method of a semiconductor device of the present invention is to form a non-single-crystal semiconductor layer in a first region and a second region over a substrate, to irradiate the non-single-crystal semiconductor layer with a first laser beam in an air atmosphere, to remove part of the non-single-crystal semiconductor layer, which is formed in the first region, to bond a separated (cleavage) single-crystal semiconductor layer to the first region, and to irradiate the non-single-crystal semiconductor layer and the separated (cleavage) single-crystal semiconductor layer with a second laser beam in an inert atmosphere.

One feature of a manufacturing method of a semiconductor device of the present invention is to include: forming a non-single-crystal semiconductor film over a substrate; removing part of the non-single-crystal semiconductor film, which is in a first region over the substrate, to form a non-single-crystal semiconductor layer in a second region over the substrate; introducing ion species into a single-crystal semiconductor substrate by implantation or doping to form an ion layer in a region at a predetermined depth from a surface of the single-crystal semiconductor substrate; forming a bonding layer on the surface of the single-crystal semiconductor substrate; bonding the bonding layer to the first region; applying energy to the single-crystal semiconductor substrate to generate a crack in the ion layer so that a single-crystal semiconductor layer remains in the first region; and performing a step of irradiating the single-crystal semiconductor layer with a laser beam in an inert atmosphere and a step of irradiating the non-single-crystal semiconductor layer with a laser beam in an air atmosphere.

Further, one feature of a manufacturing method of a semiconductor device of the present invention is to include: forming a non-single-crystal semiconductor film over a substrate; removing part of the non-single-crystal semiconductor film, which is in a first region over the substrate, to form a non-single-crystal semiconductor layer in a second region over the substrate; introducing ion species into a single-crystal semiconductor substrate by implantation or doping to form an ion layer in a region at a predetermined depth from a surface of the single-crystal semiconductor substrate; forming a bonding layer on the surface of the single-crystal semiconductor substrate; bonding the bonding layer to the first region; applying energy to the single-crystal semiconductor substrate to generate a crack in the ion layer so that a single-crystal semiconductor layer remains in the first region; irradiating the non-single-crystal semiconductor layer with a first laser beam in an air atmosphere; and irradiating the non-single-crystal semiconductor layer and the single-crystal semiconductor layer with a second laser beam in an inert atmosphere.

Further, one feature of a manufacturing method of a semiconductor device of the present invention is to include: forming a non-single-crystal semiconductor film over a substrate; irradiating the non-single-crystal semiconductor film with a first laser beam in an air atmosphere; removing part of the non-single-crystal semiconductor film, which is in a first region over the substrate, to form a non-single-crystal semiconductor layer in a second region over the substrate; introducing ion species into a single-crystal semiconductor substrate by implantation or doping to form an ion layer in a region at a predetermined depth from a surface of the single-crystal semiconductor substrate; forming a bonding layer on the surface of the single-crystal semiconductor substrate; bonding the bonding layer to the first region; applying energy to the single-crystal semiconductor substrate to generate a crack in the ion layer so that a single-crystal semiconductor layer remains in the first region; and irradiating the non-single-crystal semiconductor layer and the single-crystal semiconductor layer with a second laser beam in an inert atmosphere.

Furthermore, one feature of a manufacturing method of a semiconductor device of the present invention is to include: forming a non-single-crystal semiconductor film over a substrate; removing part of the non-single-crystal semiconductor film, which is in a first region over the substrate, to form a non-single-crystal semiconductor layer in a second region over the substrate; introducing ion species into a single-crystal semiconductor substrate by implantation or doping to form an ion layer in a region at a predetermined depth from a surface of the single-crystal semiconductor substrate; forming a bonding layer on the surface of the single-crystal semiconductor substrate; bonding the bonding layer to the first region; applying energy to the single-crystal semiconductor substrate to generate a crack in the ion layer so that a single-crystal semiconductor layer remains in the first region; forming a cap film over the non-single-crystal semiconductor layer; irradiating the non-single-crystal semiconductor layer and the single-crystal semiconductor layer with a first laser beam from above the cap film in an inert atmosphere; removing the cap film; and irradiating the non-single-crystal semiconductor layer with a second laser beam in an air atmosphere.

In addition, irradiation is preferably conducted with the second laser beam at an optimal energy density for the single-crystal semiconductor layer.

Note that in the case of irradiating semiconductors all at once with a laser beam using a cap film, energy of a laser beam is preferably set under an optimal condition determined using a laser irradiation test substrate formed from a non-single-crystal semiconductor.

The present invention can provide a high-performance semiconductor device at low cost and a manufacturing method thereof.

In addition, by irradiating a separated (cleavage) single-crystal semiconductor layer with a laser beam in an inert atmosphere and irradiating a non-single-crystal semiconductor layer with a laser beam in an air atmosphere at least one time, device characteristics of a semiconductor device which uses the separated (cleavage) single-crystal semiconductor layer and the non-single-crystal semiconductor layer can be improved.

BRIEF DESCRIPTION OF THE DRAWINGS

In the accompanying drawings:

FIGS. 9A to 9C show a manufacturing method of a semiconductor device;

DETAILED DESCRIPTION OF THE INVENTION

Figure 1:
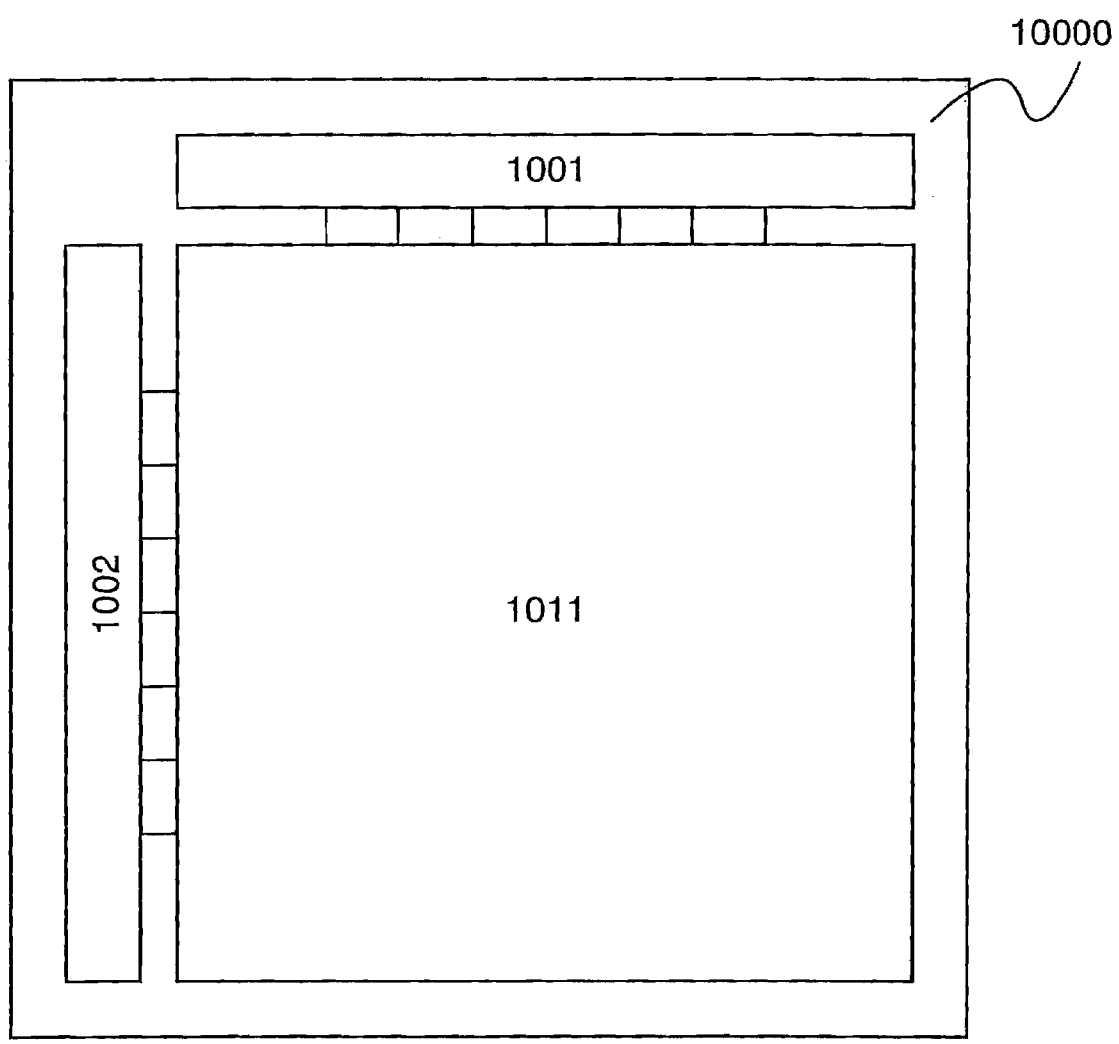
FIG. 1 is a plane view of an active matrix display device.

Embodiment modes of the present invention will be described below with reference to the drawings. It is easily understood by those skilled in the art that the present invention can be implemented in many different modes and various changes may be made in forms and details without departing from the spirit and the scope of the invention. Therefore, the present invention should not be interpreted as being limited to the descriptions of the embodiment modes below.

Note that the embodiment modes below can be combined as appropriate. If not otherwise specified, the components denoted by the same reference numerals throughout the drawings can be formed using the same material, method, or the like.

Embodiment Mode 1

Embodiment Mode 1 will describe a display device which includes a first region including a separated (cleavage) single-crystal semiconductor layer and a second region including a non-single-crystal semiconductor layer.

FIG. 1 is an example of a plane view of an active matrix liquid crystal display device, an active matrix electroluminescent display device, or the like.

In the active matrix display device, driver circuits such as a source driver circuit 1001 and a gate driver circuit 1002 are connected to a pixel area 1011, over a substrate 10000.

The driver circuits such as the source driver circuit 1001 and the gate driver circuit 1002 are circuits for controlling signals which are supplied to active elements such as transistors formed in the pixel area 1011.

Further, in a liquid crystal display device, switching of liquid crystal display elements is controlled by the transistors formed in the pixel area 1011.

Thus, since the transistors formed in the pixel area 1011 of the liquid crystal display device are used for only switching, they are not required to achieve high performance as compared with driver circuits.

On the other hand, since liquid crystal display elements have low response speed, the response speed of a liquid crystal display device should be increased by controlling drive signals.

In the case of adjusting drive signals to increase the response speed, the circuit configuration of a driver circuit is complicated, and the number of transistors in the driver circuit is increased accordingly.

However, if the number of transistors is increased, the operation speed of the driver circuit itself decreases.

Therefore, a high performance (high field effect mobility, less variation in characteristics of the semiconductor elements on the substrate) semiconductor layer is required for transistors in the driver circuit.

In view of the above, in the liquid crystal display device, it is desirable that a region where the driver circuits such as the source driver circuit 1001 and the gate driver circuit 1002 are provided is formed using a separated (cleavage) single-crystal semiconductor layer, and a region where the pixel area 1011 is provided is formed using a non-single-crystal semiconductor layer.

Further, the area of the pixel area 1011 is larger than the area occupied by the driver circuits; therefore, the pixel area 1011 is formed using a non-single-crystal semiconductor layer, so that a low-cost display device can be obtained.

Next, in the case of an electroluminescent display device, light is emitted from an electroluminescent element by applying voltage to the electroluminescent element using transistors formed in the pixel area 1011.

In the electroluminescent display device, intensity of light emitted from the electroluminescent element varies depending on the voltage applied thereto.

Further, in the case of a full-color electroluminescent display device, the optimal voltage for light emission varies between elements for red, green, and blue.

Accordingly, variation of performance of transistors easily affects display quality of the electroluminescent display device.

On the other hand, since an electroluminescent element emits light when voltage is applied, the response speed of an electroluminescent element is remarkably higher as compared with that of a liquid crystal display element.

Accordingly, the circuit configuration of an electroluminescent element is not so complicated as that of a liquid crystal display device.

From the above, it is desirable that in the electroluminescent display device, a region where the pixel area 1011 is provided be formed using a separated (cleavage) single-crystal semiconductor layer, and a region where the driver circuits such as the source driver circuit 1001 and the gate driver circuit 1002 are provided be formed using a non-single-crystal semiconductor layer.

Embodiment Mode 2

In Embodiment Mode 2, a semiconductor device capable of inputting/outputting data without contact, which includes a first region including a separated (cleavage) single-crystal semiconductor layer and a second region including a non-single-crystal semiconductor layer will be described.

Semiconductor devices capable of inputting/outputting data without contact are referred to as an RFID tag, an ID tag, an IC tag, an IC chip, an RF tag, a wireless tag, an electronic tag, or a wireless chip depending on the usage patterns. They are referred to as contactless tags (contactless chips).

Figure 2:
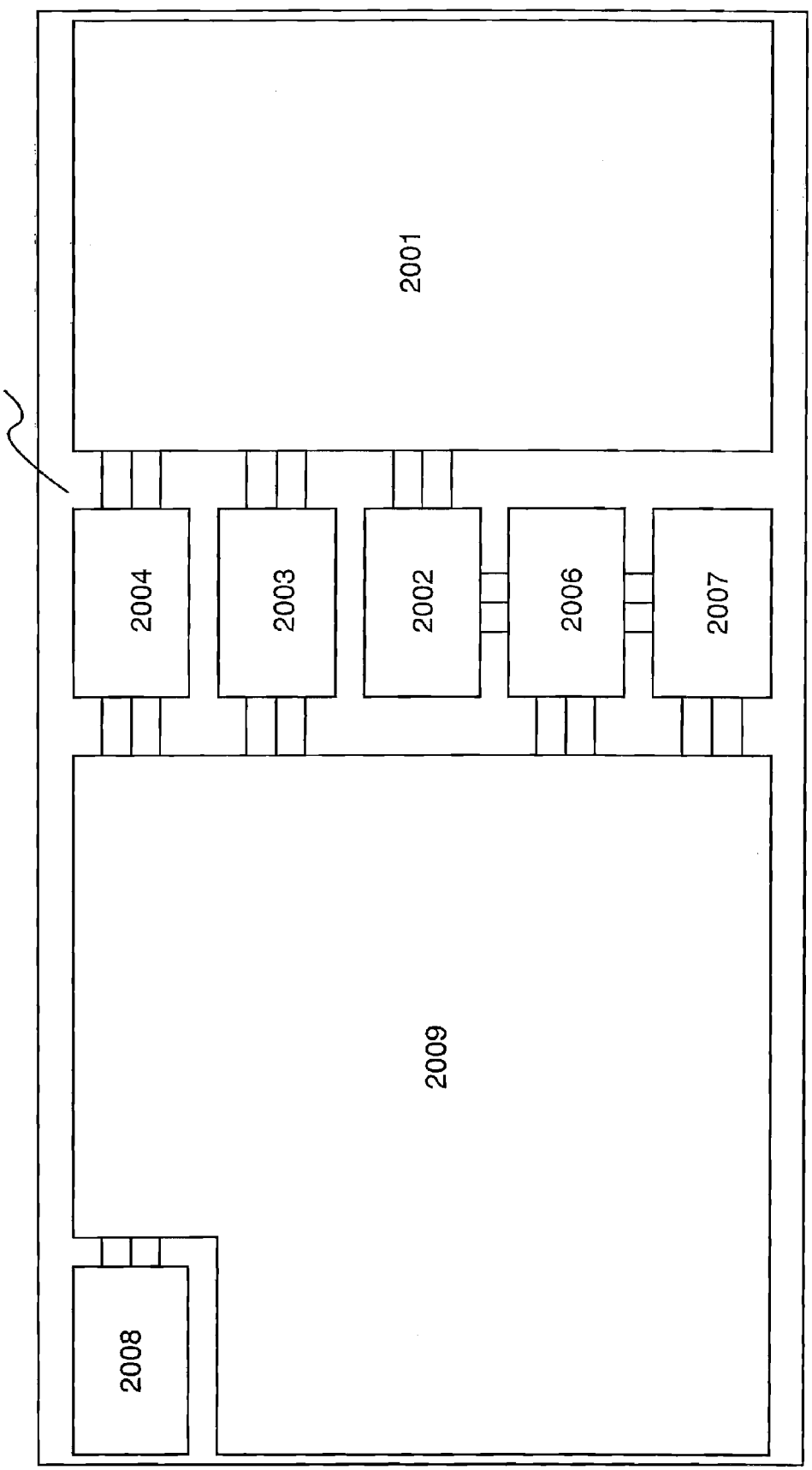
FIG. 2 is a plane view of a contactless tag.
Figure 3:
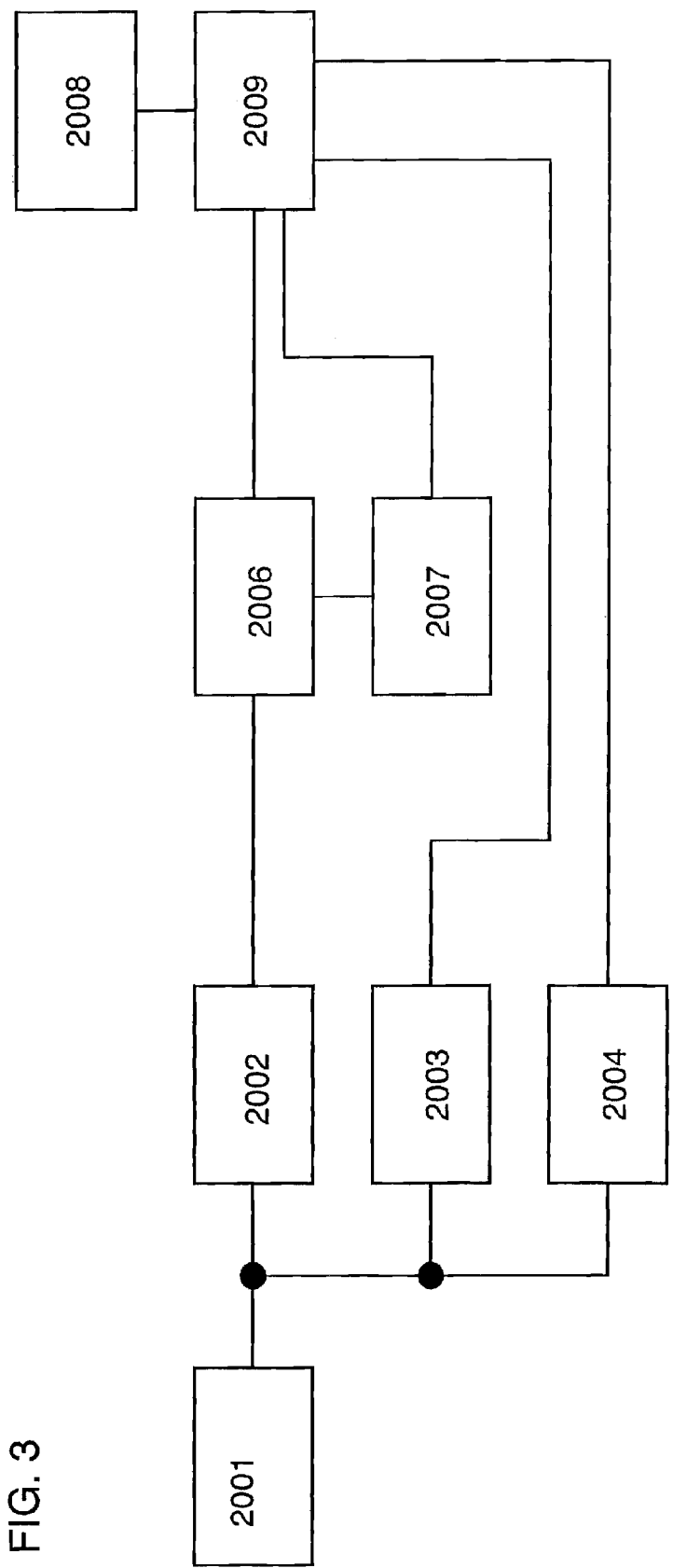
FIG. 3 is a block diagram of a contactless tag.

FIG. 2 shows an example of a plane view of a contactless tag, and FIG. 3 shows an example of a circuit diagram of a contactless tag.

An antenna 2001, a rectification circuit 2002, a demodulation circuit 2003, a modulation circuit 2004, a regulator 2006, a VCO 2007, a memory 2008, and a logic circuit 2009 are provided over a substrate 20000. Note that the VCO refers to a voltage controlled oscillator.

The rectification circuit 2002, the demodulation circuit 2003, and the modulation circuit 2004 are electrically connected to the antenna 2001.

The demodulation circuit 2003, the modulation circuit 2004, the regulator 2006, the VCO 2007, and the memory 2008 are electrically connected to the logic circuit 2009.

Further, the rectification circuit 2002 and the regulator 2006 are electrically connected to each other, and the regulator 2006 and the VCO 2007 are electrically connected to each other.

The operation of the contactless tag will be described.

The contactless tag operates in combination with a reader/writer.

A supply voltage signal and a command signal are generated from the reader/writer.

Further, the contactless tag receives the supply voltage signal and the command signal by the antenna 2001.

The supply voltage signal received by the contactless tag is rectified by the rectification circuit 2002 and then supplied to the regulator 2006.

The regulator 2006 converts the rectified supply voltage signal into a predetermined voltage and transmits it to the VCO 2007 and the logic circuit 2009.

The VCO 2007 converts the predetermined voltage transmitted from the regulator 2006 into a predetermined frequency (clock) and transmits it to the logic circuit 2009.

On the other hand, the command signal received by the contactless tag is demodulated by the demodulation circuit 2003 and transmitted to the logic circuit 2009.

The logic circuit 2009 operates with the voltage supplied from the regulator 2006 and analyzes the signal supplied from the demodulation circuit 2003 by comparing it with data stored in the memory 2008.

After the analysis, the outputted result is transmitted as a signal to the modulation circuit 2004.

Further, the answering signal transmitted from the modulation circuit 2004 through the antenna 2001 is read by the reader/writer.

As the above-described manner, the reader/writer and the contactless tag exchange data.

Here, the logic circuit 2009, the memory 2008, and the modulation circuit 2004 are digital driver circuits, and the rectification circuit 2002, the demodulation circuit 2003, the regulator 2006, and the VCO 2007 are analog driver circuits.

An analog circuit controls operation depending on the physical quantity which changes continuously, so that it is preferable to use transistors using a separated (cleavage) single-crystal semiconductor.

On the other hand, a digital circuit controls operation depending on the discrete physical quantity, so that transistors with performance inferior to those used for the analog driver circuit may be used.

Accordingly, it is preferable that transistors of the analog driver circuits are formed using a separated (cleavage) single-crystal semiconductor and transistors of the digital driver circuits are formed using a non-single-crystal semiconductor.

Note that the modulation circuit 2004 is a digital driver circuit; however, since the circuit configuration is simple, it occupies a small area over the substrate. Therefore, the modulation circuit 2004 can be formed in an unoccupied space using a separated (cleavage) single-crystal semiconductor; thus, high integration can be achieved.

Embodiment Mode 3

In Embodiment Mode 3, a method for forming a separated (cleavage) single-crystal semiconductor layer will be described with reference to FIGS. 4A to 4C and FIG. 5.

First, a semiconductor substrate is prepared. As the semiconductor substrate, a substrate formed of single-crystal silicon, a single-crystal gallium arsenide substrate, or the like can be used. Further, a semiconductor substrate formed of polycrystals of silicon, germanium-gallium arsenide, or the like or a substrate on which silicon, germanium-gallium arsenide, or the like is formed, can be used.

Note that in the case where a polycrystalline semiconductor substrate is used, a separated semiconductor layer is a separated (cleavage) polycrystalline semiconductor layer.

Figure 4A:
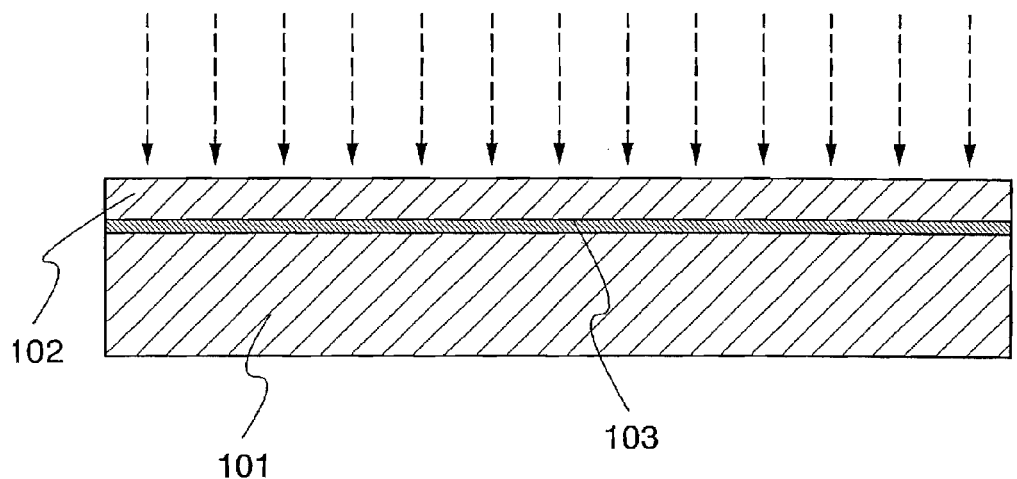
FIGS. 4A to 4C show a manufacturing method of a separated (cleavage) single-crystal semiconductor layer.
Figure 4B:
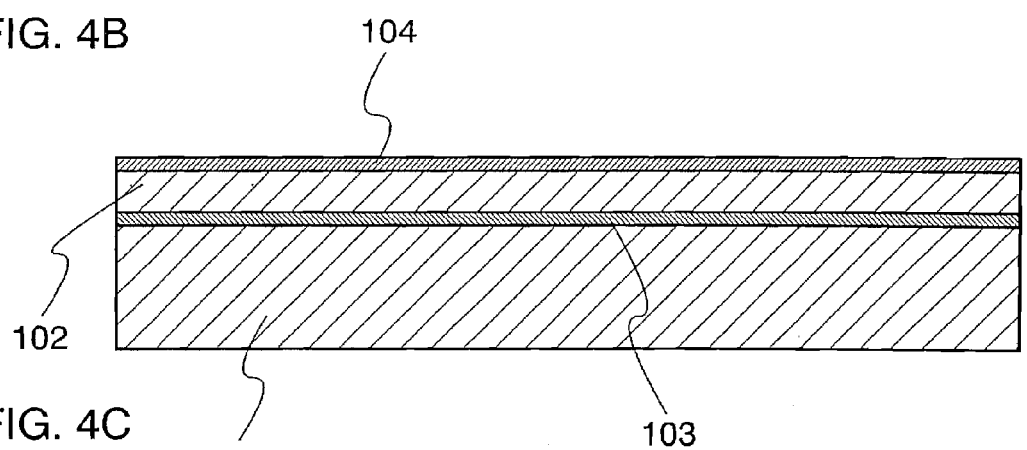

Next, after cleaning a surface of the semiconductor substrate, ions accelerated by an electric field are introduced into a predetermined depth of the semiconductor substrate from the surface side by implantation or doping, thereby an ion layer 103 is formed between a first single-crystal semiconductor layer 101 and a second single-crystal semiconductor layer 102 (FIG. 4A).

The position where the ion layer 103 is formed depends on the acceleration of the ions. Accordingly, the thickness of the second single-crystal semiconductor layer 102 can be controlled by determining the acceleration of the ions.

The thickness of the second single-crystal semiconductor layer 102 is from 5 nm to 500 nm, and preferably from 10 nm to 200 nm.

Ions introduced by implantation or doping may be ion species composed of one or more atoms of hydrogen, helium, and halogen.

In the case where doping with hydrogen ions is performed, a plurality of hydrogen ions having different mass numbers, that is, ions of $H^+$, $H_2^+$, and $H_3^+$ are used. Further, when the proportion of $H_3^+$ ions is the highest among the ions applied by irradiation, the mass of hydrogen introduced by doping per unit time is increased; thus, the time required for doping can be shortened.

Further, if ion implantation or ion doping is performed in a state where the surface of the semiconductor substrate is bare, the surface would become rough.

In response, a protective film having a thickness of 50 nm to 200 nm is preferably provided over the surface of the semiconductor substrate because roughness of the surface can be prevented and precision of controlling the depth in ion implantation or ion doping is increased through the protective film.

The protective film is preferably formed by forming a silicon oxide film over the surface of the semiconductor substrate, and stacking a silicon nitride film or a silicon nitride oxide film on the silicon oxide film.

Such a protective film is preferable because, after bonding, contaminants from a substrate can be prevented by the silicon nitride film or the silicon nitride oxide film, and the silicon oxide film can serve as a base film with which good interface characteristics between the base and the semiconductor can be obtained.

Next, a silicon oxide film is formed as a bond layer 104 on the surface side of the semiconductor substrate.

As the bond layer 104, a silicon oxide film which is formed by chemical vapor deposition using an organosilane gas is preferable.

As the organosilane gas, a silicon containing compound such as tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

A silicon oxide film formed by chemical vapor deposition using an organosilane gas as described above is referred to as an organosilane film.

As to the organosilane film, a reactant moves quickly on the reaction surface in the film formation; therefore, a film having a flat surface with high step coverage can be obtained.

Figure 4C:
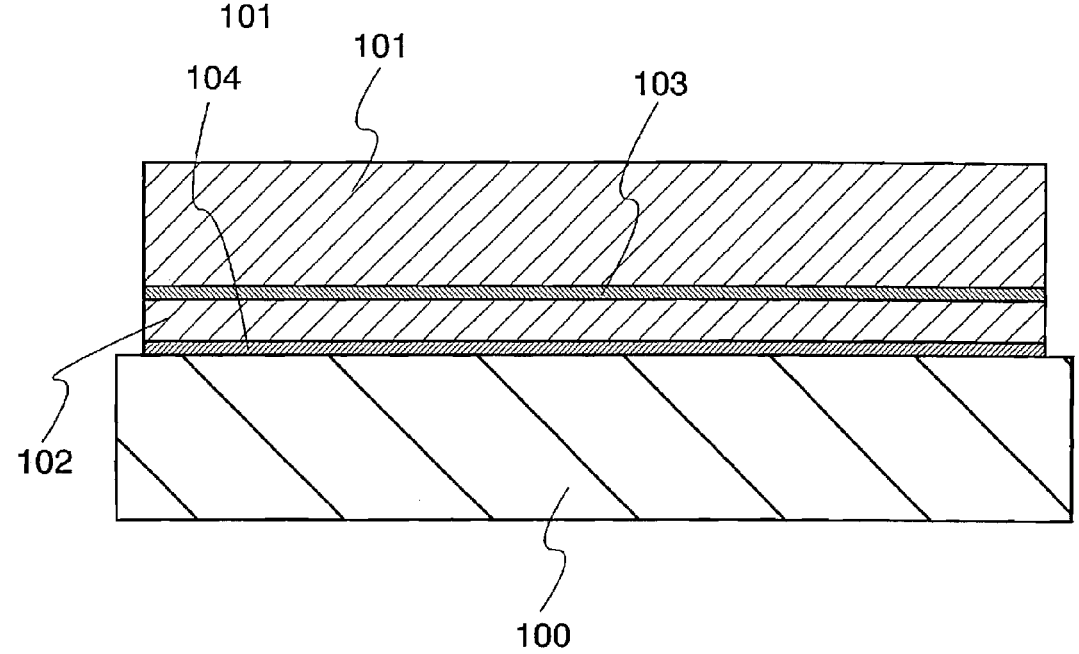

Next, a surface of a base substrate 100 and a surface of the bond layer 104 are cleaned. Then, the surface of the base substrate 100 and the surface of the bond layer 104 are bonded to each other by contact (FIG. 4C).

Heat treatment may be performed to increase bonding strength. The heat treatment may be performed at a temperature of from 200° C. to 1100° C. In the case of using a glass substrate, the temperature of the heat treatment is preferably less than or equal to 600° C.

They can be bonded to each other only by contact because both the surface of the bond layer 104 and the surface of the base substrate 100 are flat.

Accordingly, a silicon oxide film formed by chemical vapor deposition using an organosilane gas may be provided on the surface of the base substrate 100.

If one or both of the surface of the bond layer 104 and the surface of the base substrate 100 are not flat, the bonding force is decreased.

Next, a crack is created along the ion layer 103 (which may also referred to as a separation layer, a fragile layer, or a release layer) by performing heat treatment, thereby the first single-crystal semiconductor layer 101 is separated.

Figure 5:
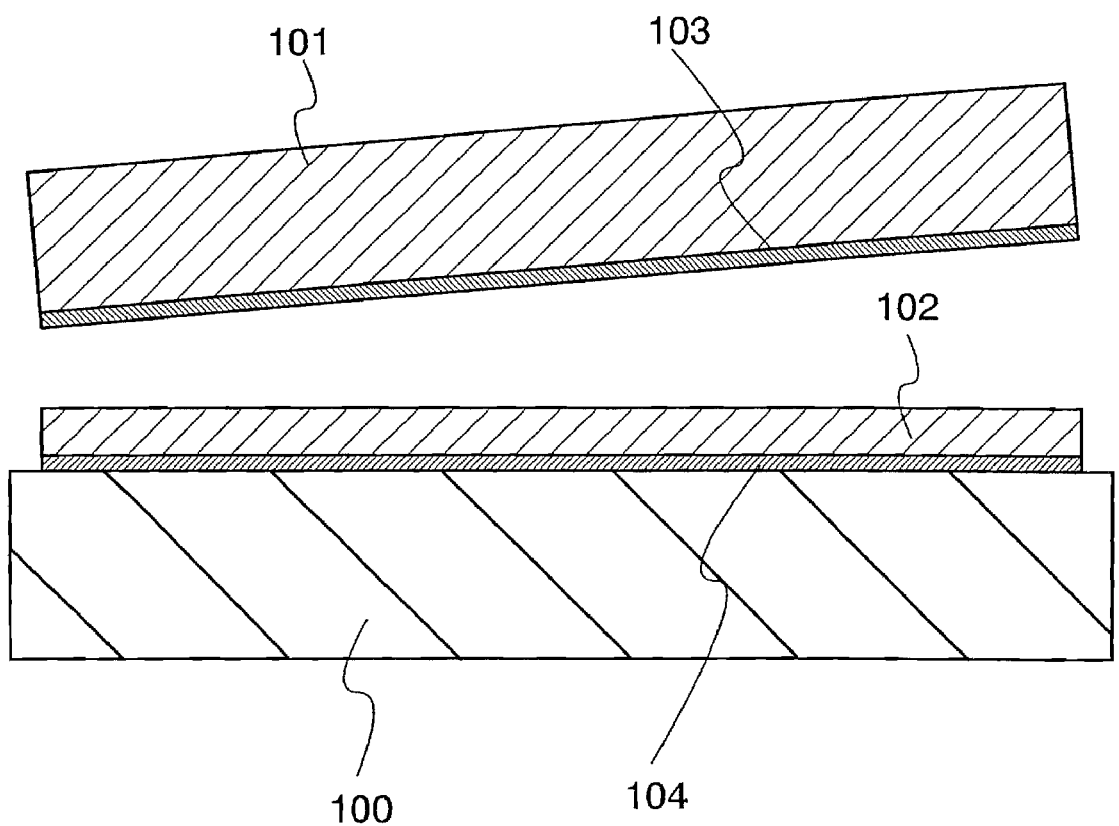
FIG. 5 shows a manufacturing method of a separated (cleavage) single-crystal semiconductor layer.

Crack creation mechanism is as follows. First, voids are generated in the semiconductor substrate by ion implantation or ion doping. Secondly, the voids are grown by heat treatment to form cavities. Thirdly, the cavities are connected to form a crack (FIG. 5).

The heat treatment is preferably performed at a temperature higher than the film formation temperature of the bond layer 104 and lower than the upper temperature limit of the base substrate 100. For example, in the case where a low-thermostable glass substrate is used as the base substrate 100, heat treatment at a temperature of from 400° C. to 600° C. is preferable.

The second single-crystal semiconductor layer 102 which remains over the surface of the base substrate 100 as described above is the separated (cleavage) single-crystal semiconductor layer.

Embodiment Mode 4

In Embodiment Mode 4, a process up to laser beam irradiation of a first region 5001 including a separated (cleavage) single-crystal semiconductor layer and a second region 5002 including a non-single-crystal semiconductor layer will be described.

Figure 6A:
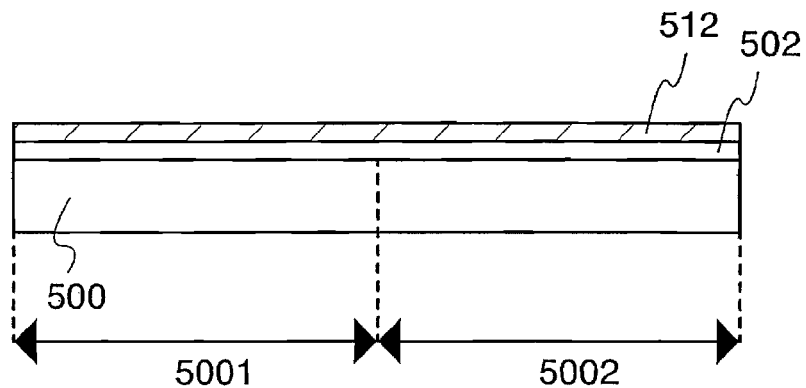
FIGS. 6A to 6C show a manufacturing method of a semiconductor device.

First, a base film 502 and a non-single-crystal semiconductor layer 512 are formed over a substrate 500 (FIG. 6A).

As the substrate 500, a substrate selected from a variety of glass substrates that are used in the electronics industry is used, such as a substrate of aluminosilicate glass, aluminoborosilicate glass, or barium borosilicate glass. In addition, a substrate of quartz glass, a semiconductor substrate such as a silicon wafer, or the like can also be used.

Further, as the base film 502, a single layer of a silicon oxide film, a silicon nitride film, a silicon nitride oxide film, a silicon oxynitride film, or a resin film can be used, or a film laminate thereof can be used.

In this specification, the silicon oxynitride film and the silicon nitride oxide film are defined as follows. A silicon oxynitride film means a film that includes oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. On the other hand, a silicon nitride oxide film means a film that includes oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. The concentrations of four elements, oxygen, nitrogen, silicon, and hydrogen, given above are values which are obtained by converting values measured by Rutherford backscattering spectrometry (RBS) and hydrogen forward scattering (HFS).

The base film 502 is preferably provided in the case where a glass substrate is used, in order to prevent contamination from the substrate.

A base film that is preferred for a glass substrate is a base layer that is formed by stacking a silicon oxide film on a silicon nitride film or a silicon nitride oxide film which is formed over the substrate.

A silicon nitride film or a silicon nitride oxide film has an excellent blocking property and prevents contamination from the substrate. However, if a channel formation region is formed in contact with the silicon nitride film, a trap level is formed and operation of a TFT is adversely affected. Therefore, it is preferable to provide a silicon oxide film as a buffer between the non-single-crystal semiconductor layer 512 and the silicon nitride film.

Further, for the non-single-crystal semiconductor layer 512, an amorphous semiconductor, a microcrystalline semiconductor, or a polycrystalline semiconductor is used. As a material, silicon, silicon germanium, gallium arsenide, or the like is used. As a formation method, a CVD method, a sputtering method, or the like can be used. The film thickness is from 5 nm to 500 nm, and preferably 10 nm to 200 nm.

Note that the thickness of the non-single-crystal semiconductor layer is preferably thinner than that of the separated (cleavage) single-crystal semiconductor layer. This is because yield of separation is increased when the thickness of the separated (cleavage) single-crystal semiconductor layer is large, and the non-single-crystal semiconductor layer has better characteristics when it is thin.

Figure 6B:
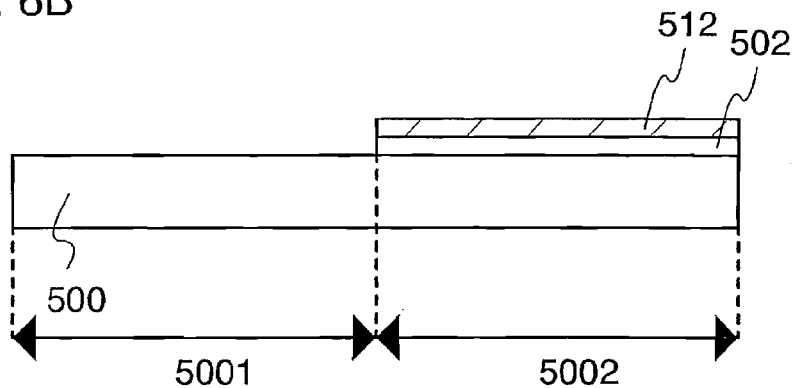

Next, the non-single-crystal semiconductor layer 512 and the base film 502 which are formed in the first region 5001 are removed, so that the non-single-crystal semiconductor layer 512 and the base film 502 are left only in the second region 5002 (FIG. 6B).

As the removal method, wet etching is preferable to maintain flatness of the substrate 500.

Figure 6C:
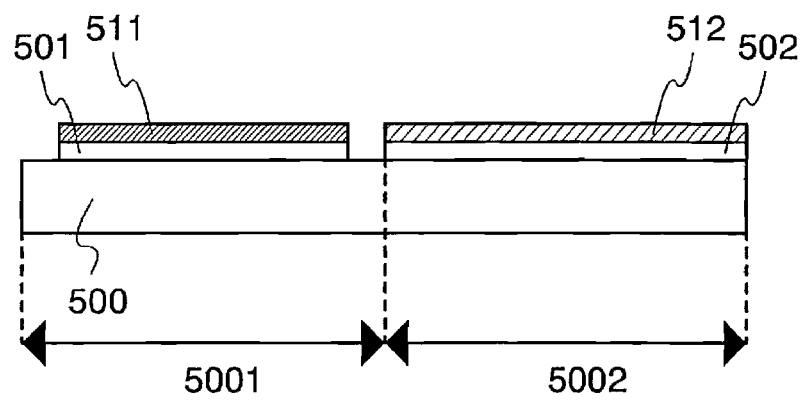

Next, using the method in Embodiment Mode 3, an insulating film 501 and a separated (cleavage) single-crystal semiconductor layer 511 are formed over the substrate in the first region 5001 (FIG. 6C).

At this time, hydrogen in the non-single-crystal semiconductor layer can be released by heat treatment at a temperature of from 400° C. to 600° C. for separation.

In the case of performing heat treatment in order to increase bonding strength, the heat treatment is performed at a temperature of from 400° C. to 600° C. at the time of bonding, so that increase in bonding strength, separation, and release of hydrogen can be realized together.

Note that release of hydrogen makes it possible to prevent ablation of the non-single-crystal semiconductor layer during laser irradiation.

A surface of the insulating film 501, which is in contact with a substrate surface is flat. Further, another insulating film may be provided between the insulating film 501 and the separated (cleavage) single-crystal semiconductor layer 511.

The other insulating film preferably includes a silicon oxide film that is in contact with the separated (cleavage) single-crystal semiconductor layer 511 and a silicon nitride film or a silicon nitride oxide film which is in contact with the silicon oxide film.

Figure 7A:
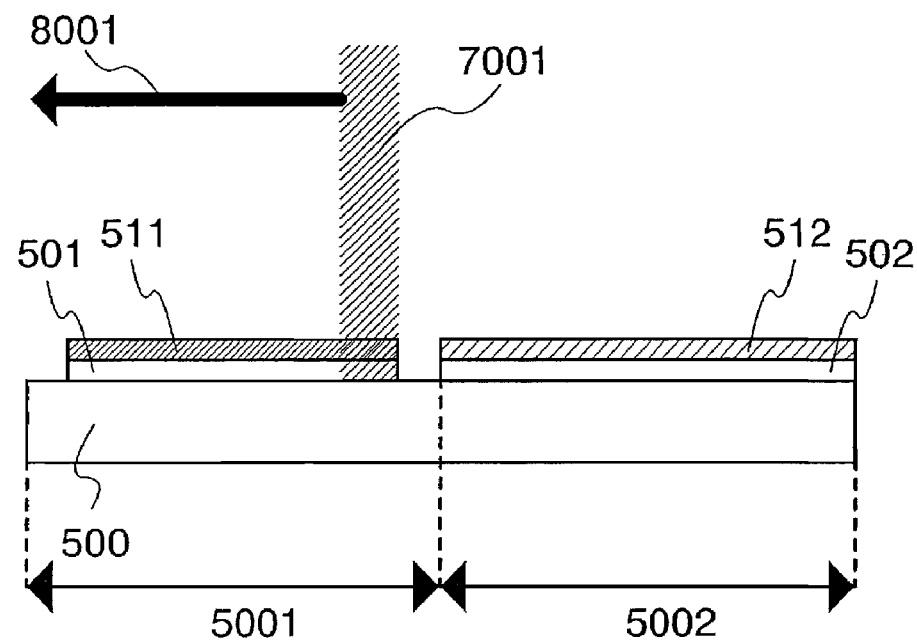
FIGS. 7A and 7B show a manufacturing method of a semiconductor device.

Next, selective irradiation is performed in an inert atmosphere by scanning only the separated (cleavage) single-crystal semiconductor layer 511 with a laser beam 7001 in a direction indicated by an arrow 8001 (FIG. 7A).

The inert atmosphere is an atmosphere with a low oxygen concentration, and for example, a nitrogen atmosphere, a rare gas atmosphere, and the like can be given.

This laser beam can be formed with a pulsed laser of an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, a gold vapor laser, or the like.

Figure 7B:
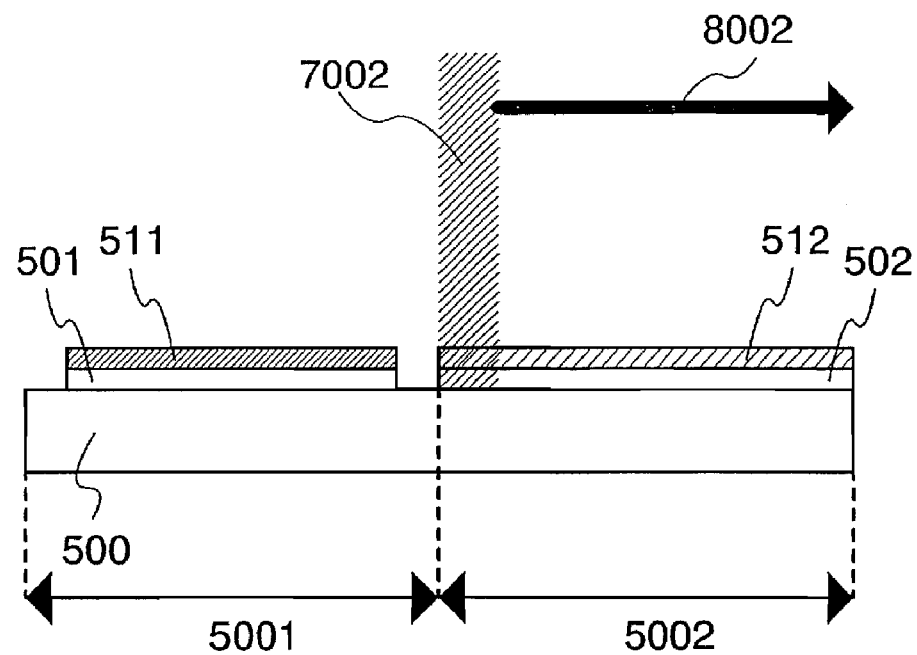

Then, selective irradiation is performed in an air atmosphere by scanning only the non-single-crystal semiconductor layer 512 with a laser beam 7002 in a direction indicated by an arrow 8002 (FIG. 7B).

As the laser beam for crystallizing the non-single-crystal semiconductor layer, a laser beam obtained with a continuous wave laser (hereinafter also referred to as a CW laser) or a pulsed wave laser (hereinafter also referred to as a pulsed laser) can used.

As the laser, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser can be used.

Note that since the type of oscillation is determined by not only the medium of the laser beam but also the output method, there are many mediums which can be output by both pulse oscillation and continuous oscillation.

In the case of using a CW laser, the power density of a laser beam may be appropriately from 0.01 $MW/cm^2$ to 100 $MW/cm^2$ (preferably, 0.1 $MW/cm^2$ to 10 $MW/cm^2$).

In the case where laser crystallization is performed using a CW laser, a semiconductor layer can continuously receive energy; therefore, once the semiconductor layer is melted, the melted state can continue. Therefore, a solid-liquid interface of the semiconductor layer can be moved by scanning with a CW laser beam, and crystal grains which are long in one direction along this moving direction can be formed, which is preferable.

At this time, it is preferable to use a solid-state laser because the output is more stable as compared to a gas laser or the like and thus more stable processing can be expected.

Further, when a pulsed laser with a repetition rate of 10 MHz or more is used, a similar effect to that of the CW laser can be obtained.

Furthermore, in the case of silicon, the absorptance of a laser beam is very high when the wavelength of the laser beam is less than or equal to 200 nm. Even a laser beam having a wavelength of from 200 nm to 600 nm is practical because the absorptance of the laser beam is high and the output of the laser beam having such a wavelength is also high.

However, there are few kinds of laser beams with stable output and a large spot in the laser beams having a wavelength of from 200 nm to 600 nm.

In view of this situation, it is preferable to carry out indirect heating using a laser beam having a wavelength of 600 nm or more.

Indirect heating is carried out in such a manner that a light absorption layer is provided over a semiconductor layer and the light absorption layer is irradiated with a laser beam. For example, a light absorption layer (e.g., tungsten, molybdenum, titanium, or the like) is provided, and the light absorption layer is irradiated with a laser beam having a wavelength which is highly absorbed by the light absorption layer. Then, the metal layer is removed.

Thus, it is preferable to use indirect heating because the kinds of selectable laser beams are increased.

Note that the scanning directions of the laser beams are not limited to the directions indicated by the arrow 8001 and the arrow 8002. The scanning may be carried out by moving the laser beam itself or by moving the substrate relative to the laser beam.

The method for selectively irradiating the separated (cleavage) single-crystal semiconductor layer 511 or the non-single-crystal semiconductor layer 512 with a laser beam is not limited to the method as in this embodiment mode, in which the scanning direction of a laser beam is adjusted.

For example, there are a first method in which a laser beam is blocked by a blocking plate (e.g., a metal plate of stainless steel or the like) provided over a region that is not irradiated with a laser beam, a second method in which a reflective film (e.g., a film in which insulating films with different refractive indexes are stacked, or a metal film) is formed over a semiconductor layer that is not irradiated with a laser beam, and the like.

In the second method, specifically, the reflective film (e.g., a film in which insulating films with different refractive indexes are stacked, or a metal film) is formed over the semiconductor layer before irradiation with the laser beam, irradiation with the laser beam is carried out, and the reflective film is removed.

As the film in which insulating films with different refractive indexes are stacked, a stack of a silicon oxide film and a silicon nitride film is formed, for example. When a plurality of stacks each including a silicon oxide film and a silicon nitride film are formed, the reflectance becomes higher.

As the metal film, titanium, aluminum, tungsten, tantalum, or the like is used, for example. In particular, tungsten, tantalum, titanium, or the like which has a high melting point is preferably used.

As shown in FIGS. 1 and 2, a separated (cleavage) single-crystal semiconductor layer and a non-single-crystal semiconductor layer are arranged over a substrate with various shapes depending on the design. Accordingly, in the case of using a method in which the scanning direction of a laser beam is adjusted, the width of the laser beam is also preferably adjusted.

Further, it is preferable to use the first method or the second method because the scanning direction of a laser beam and the width of a laser beam need not be adjusted.

In the second method in particular, the reflective film can be selectively provided by a photolithography technique; therefore, a region irradiated with a laser beam can be precisely controlled.

In this embodiment mode, after irradiating the separated (cleavage) single-crystal semiconductor layer 511 with a laser beam in an inert atmosphere, the non-single-crystal semiconductor layer 512 is irradiated with a laser beam in an air atmosphere.

However, after irradiating the non-single-crystal semiconductor layer 512 with a laser beam in an air atmosphere, the separated (cleavage) single-crystal semiconductor layer 511 may be irradiated with a laser beam in an inert atmosphere.

By using the method of this embodiment mode, improvement in characteristics of a non-single-crystal semiconductor layer and improvement in flatness and characteristics of a separated (cleavage) single-crystal semiconductor layer can be achieved.

This embodiment mode shows the method in which both laser irradiation of the separated (cleavage) single-crystal semiconductor layer and laser irradiation of the non-single-crystal semiconductor layer are performed by scanning with a linear laser beam, as an example.

However, a desired region may be irradiated with a laser beam having a plane shape or a laser beam having a spot shape.

Embodiment Mode 5

In Embodiment Mode 5, a process up to laser beam irradiation of the first region 5001 including the separated (cleavage) single-crystal semiconductor layer and the second region 5002 including the non-single-crystal semiconductor layer will be described.

First, the separated (cleavage) single-crystal semiconductor layer 511 and the non-single-crystal semiconductor layer 512 are provided over the substrate by the method shown in Embodiment Mode 4 (FIGS. 6A to 6C).

Figure 8A:
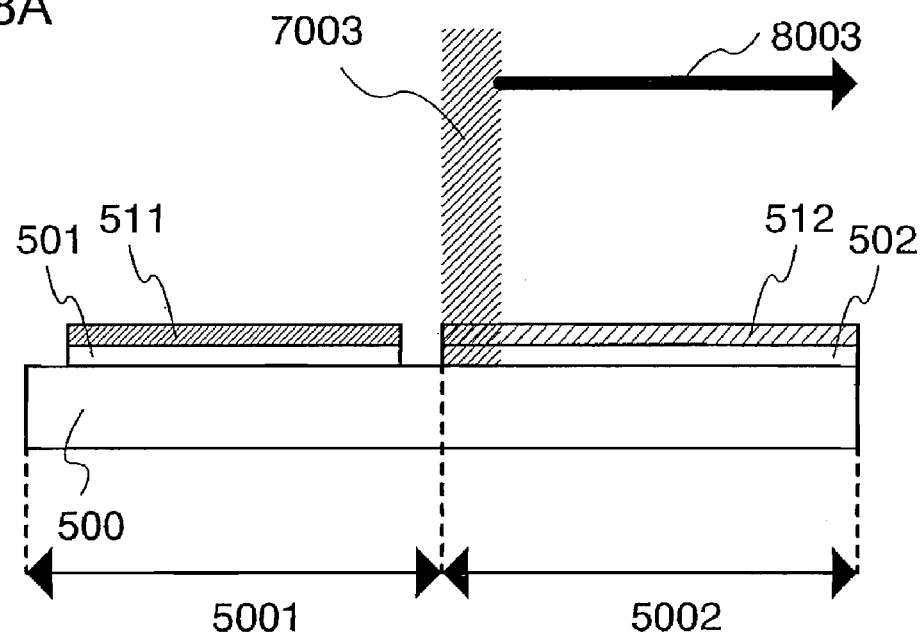
FIGS. 8A and 8B show a manufacturing method of a semiconductor device.

Then, selective irradiation is performed in an air atmosphere by scanning only the non-single-crystal semiconductor layer 512 with a laser beam 7003 in a direction indicated by an arrow 8003 (FIG. 8A).

Note that the separated (cleavage) single-crystal semiconductor layer 511 and the non-single-crystal semiconductor layer 512 may be irradiated with a laser beam in an air atmosphere; this is preferable since a mask for selective laser beam irradiation is not needed.

Figure 8B:
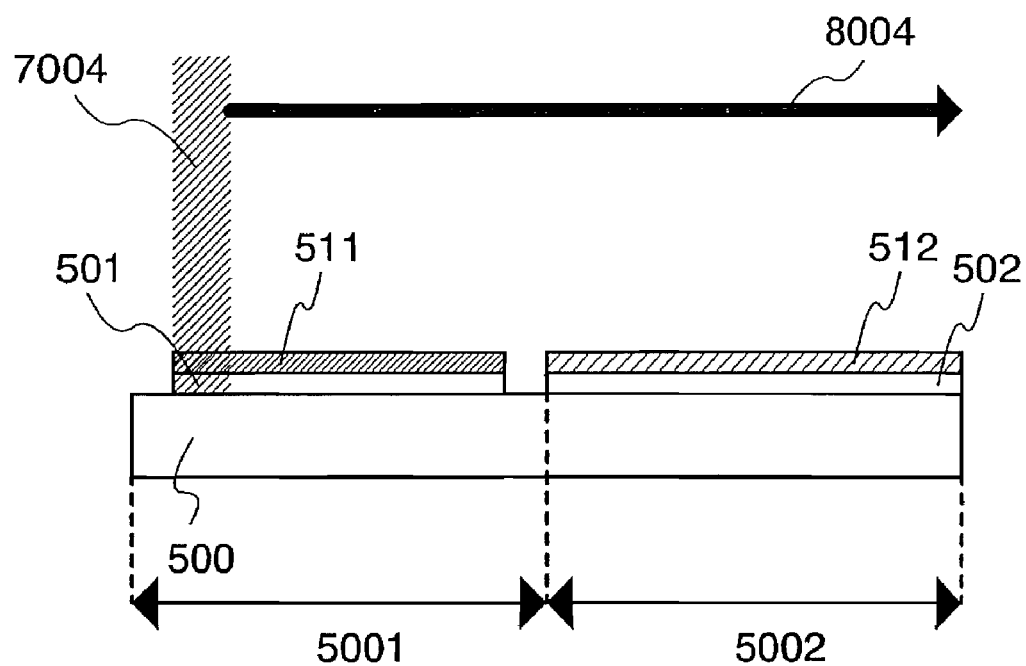

Next, irradiation is performed in an inert atmosphere by scanning the separated (cleavage) single-crystal semiconductor layer 511 and the non-single-crystal semiconductor layer 512 with a laser beam 7004 in a direction indicated by an arrow 8004 (FIG. 8B).

Note that the scanning directions of the laser beams are not limited to the directions indicated by the arrow 8003 and the arrow 8004. The scanning may be carried out by moving the laser beam itself or by moving the substrate relative to the laser beam.

By using the method of this embodiment mode, characteristics and flatness of the separated (cleavage) single-crystal semiconductor layer 511 and the non-single-crystal semiconductor layer 512 can be ensured.

Since the number of selective irradiations with a laser beam can be reduced compared to that of the method of Embodiment Mode 4, the number of adjustments of the laser beam scanning range, the number of usages of a blocking plate, or the number of usages of a reflective film can be reduced, which leads to cost reduction.

Here, the optimal energy density for the separated (cleavage) single-crystal semiconductor layer 511 and the optimal energy density for the non-single-crystal semiconductor layer 512 are different.

For example, the optimal values are different depending on the thickness and the film quality. For example, in the case where the thickness of a semiconductor layer which is formed of silicon is 50 nm, the optimal energy density is from 350 $mJ/cm^2$ to 450 $mJ/cm^2$. In the case of the semiconductor layer which is formed of silicon is 100 nm, the optimal energy density is from 600 $mJ/cm^2$ to 700 $mJ/cm^2$.

Therefore, in the case where the separated (cleavage) single-crystal semiconductor layer 511 and the non-single-crystal semiconductor layer 512 are irradiated with a laser beam all at once, laser beam irradiation has to be performed under conditions such that the energy density of the laser beam is the optimal energy density for both the separated (cleavage) single-crystal semiconductor layer 511 and the non-single-crystal semiconductor layer 512.

Therefore, in the case where the separated (cleavage) single-crystal semiconductor layer 511 and the non-single-crystal semiconductor layer 512 are irradiated with a laser beam all at once, the selectable range of the energy density of the laser beam becomes narrower. Further, in the case where the film thickness or the film quality is largely different, laser beam irradiation cannot be performed all at once.

However, in this embodiment mode, laser beam irradiation is performed twice to the non-single-crystal semiconductor layer 512.

Laser beam irradiation needs to be performed with an optimal energy density. However, in the case where laser beam irradiation is performed twice to the non-single-crystal semiconductor layer 512, as long as the first laser beam irradiation is performed with the optimal energy density, even when the second laser beam irradiation is performed with an energy density which is not optimal for the non-single-crystal semiconductor layer 512, characteristics can be ensured.

Accordingly, since the second laser beam irradiation can be performed with an energy density within the optimal energy density range of the separated (cleavage) single-crystal semiconductor layer 511 in this embodiment mode, the problem in that the selectable range of the energy density of the laser beam becomes narrower can be prevented. Therefore, this embodiment mode is preferable.

Embodiment Mode 6

In Embodiment Mode 6, a process up to laser beam irradiation of the first region 5001 including the separated (cleavage) single-crystal semiconductor layer and the second region 5002 including the non-single-crystal semiconductor layer will be described.

Figure 9A:
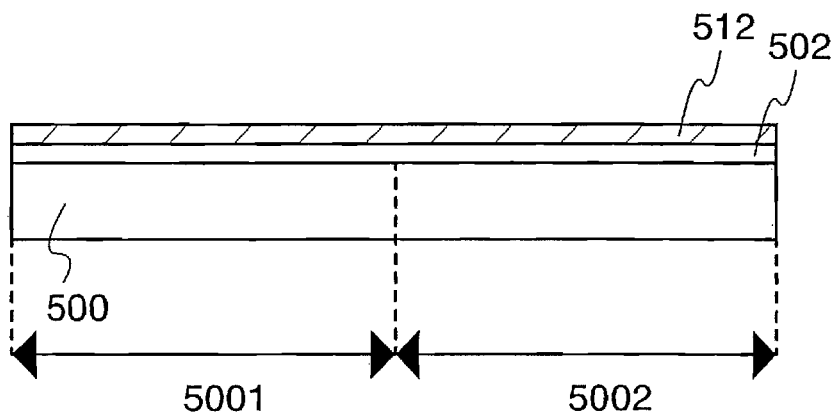

First, the base film 502 is formed over the substrate 500, and the non-single-crystal semiconductor layer 512 is formed over the base film 502 (FIG. 9A).

Figure 9B:
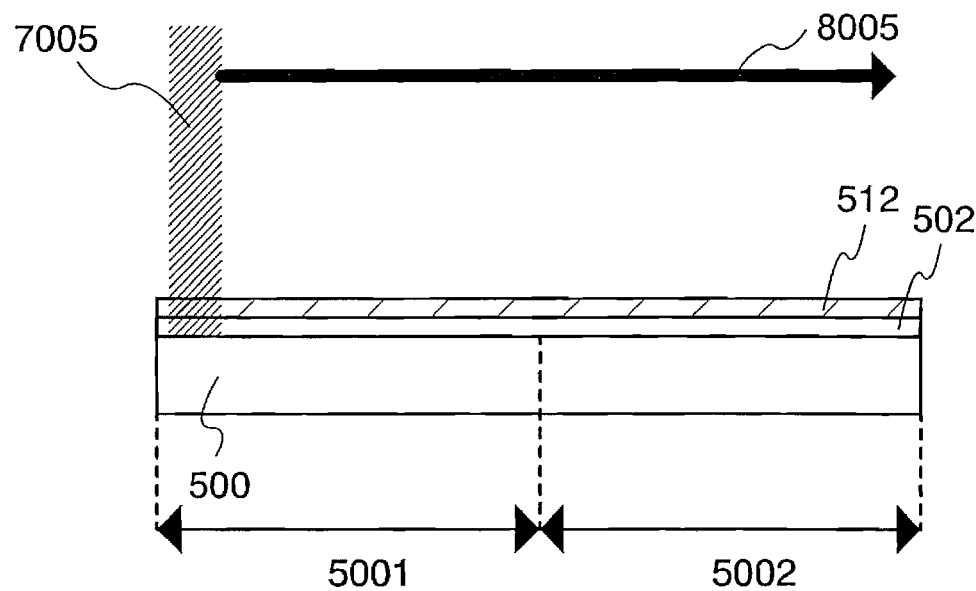
Figure 9B:
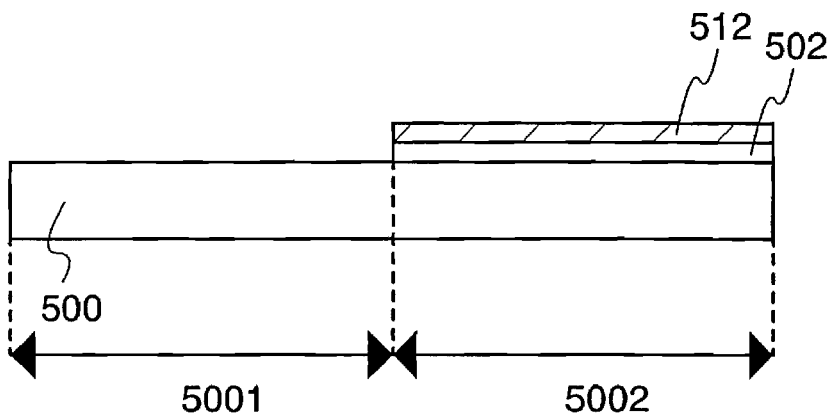

Next, selective irradiation is performed in an air atmosphere by scanning the non-single-crystal semiconductor layer 512 with a laser beam 7005 in a direction indicated by an arrow 8005 (FIG. 9B).

Heat treatment for releasing hydrogen is preferably performed to the non-single-crystal semiconductor layer 512 before laser irradiation in order to prevent ablation of the layer.

Next, the non-single-crystal semiconductor layer 512 and the base film 502 in the first region 5001 are removed (FIG. 9C).

As the removing method, wet etching is preferable in order to keep the flatness of the substrate 500.

Figure 10A:
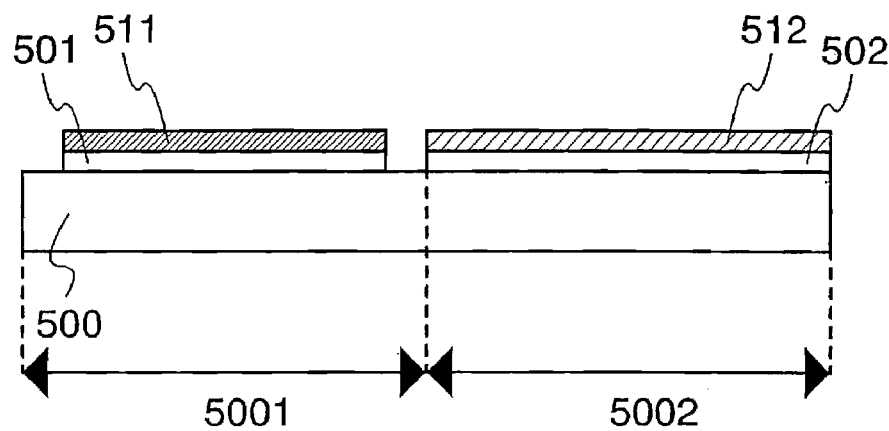
FIGS. 10A and 10B show a manufacturing method of a semiconductor device.

Next, the separated (cleavage) single-crystal semiconductor layer 511 and the insulating film 501 are provided so as to be bonded to the substrate 500 (FIG. 10A).

Figure 10B:
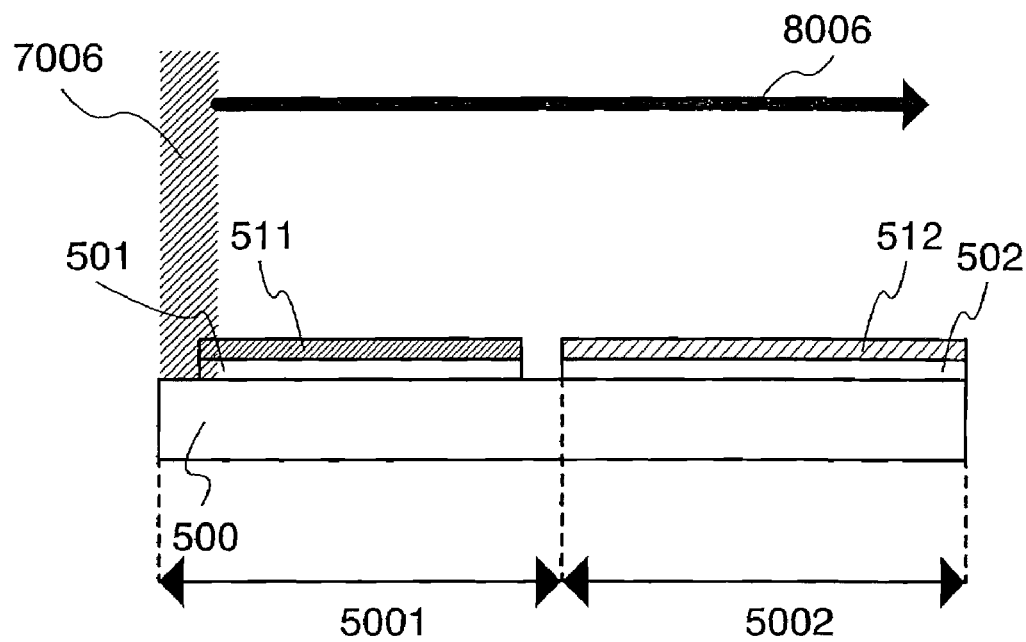

Next, irradiation is performed in an inert atmosphere by scanning the separated (cleavage) single-crystal semiconductor layer 511 and the non-single-crystal semiconductor layer 512 with a laser beam 7006 in a direction indicated by an arrow 8006 (FIG. 10B).

Note that the scanning directions of the laser beams are not limited to the directions indicated by the arrow 8005 and the arrow 8006. The scanning may be carried out by moving the laser beam itself or by moving the substrate relative to the laser beam.

By using the method of this embodiment mode, characteristics and flatness of the separated (cleavage) single-crystal semiconductor layer 511 and the non-single-crystal semiconductor layer 512 can be ensured.

Further, the method of this embodiment mode is excellent compared to the methods of Embodiment Mode 4 and Embodiment Mode 5 in that the number of selective irradiations with a laser beam can be reduced.

Furthermore, in this embodiment mode, since the second laser beam irradiation can be performed with an energy density within the optimal energy density range of the separated (cleavage) single-crystal semiconductor layer 511 similarly to Embodiment Mode 5, the problem in that the selectable range of the energy density of the laser beam becomes narrower can be prevented. Therefore, this embodiment mode is preferable.

Embodiment Mode 7

Embodiment Mode 7 will describe a manufacturing process of a semiconductor device.

First, the separated (cleavage) single-crystal semiconductor layer 511 and the non-single-crystal semiconductor layer 512 which are irradiated with a laser beam are etched so as to be processed into island shapes. Note that laser beam irradiation may be performed after processing the semiconductor layers into island shapes.

Figure 11A:
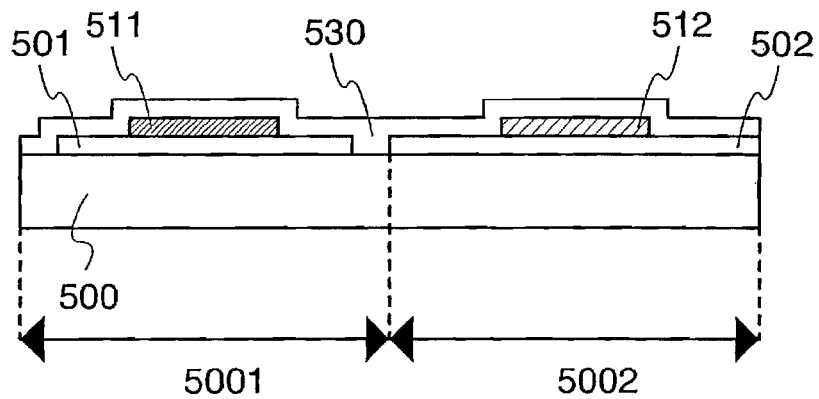
FIGS. 11A to 11C show a manufacturing method of a semiconductor device.

Next, a gate insulating film 530 is formed over the separated (cleavage) single-crystal semiconductor layer 511 and the non-single-crystal semiconductor layer 512 (FIG. 11A).

As the material of the gate insulating film 530, a silicon nitride film, a silicon oxide film, a silicon nitride oxide film, a silicon oxynitride film, or the like can be used.

The formation method of the gate insulating film 530 can be a CVD method, a sputtering method, or the like. The gate insulating film may have a stacked structure. The thickness of the gate insulating film 530 is preferably as thin as possible, and preferably less than or equal to 200 nm. In the case of thinning the channel formation region, the thickness of the gate insulating film 530 is less than or equal to 50 nm, and more preferably less than or equal to 20 nm.

Figure 11B:
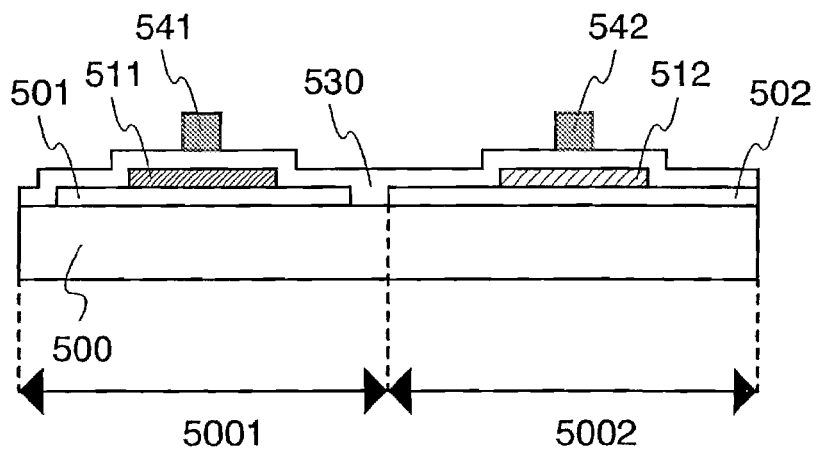

Then, a gate electrode 541 and a gate electrode 542 are formed over the gate insulating film 530 (FIG. 11B).

The gate electrodes are formed using a conductive film having a single layer or stacked layer structure using W, Ta, Mo, Cr, Cu, Nd, Al, Al—Nd, Al—Si, Al—Ti, or the like by a sputtering method. Alternatively, n-type or p-type silicon may be used. The thickness is preferably from 50 nm to 500 nm.

Next, an impurity element imparting a conductivity type is added to form an impurity region.

The impurity element imparting a conductivity type is added to form at least a source region and a drain region. A low-concentration impurity region may be provided as necessary.

When the impurity element imparting a conductivity type is n-type, phosphorus, arsenic, or the like can be used. When the impurity element imparting a conductivity type is p-type, boron can be used. The addition of the impurity element can be conducted by a method such as ion doping, ion implantation, laser doping, or a thermal diffusion method.

This embodiment mode is described using the example in which only one element is shown, for convenience. However, it is preferable to form a plurality of elements over the substrate to form a CMOS circuit in which both an n-channel TFT and a p-channel TFT are formed.

In the case of forming the CMOS circuit, an n-type impurity element and a p-type impurity element may be added in separate steps using resist masks.

Figure 11C:
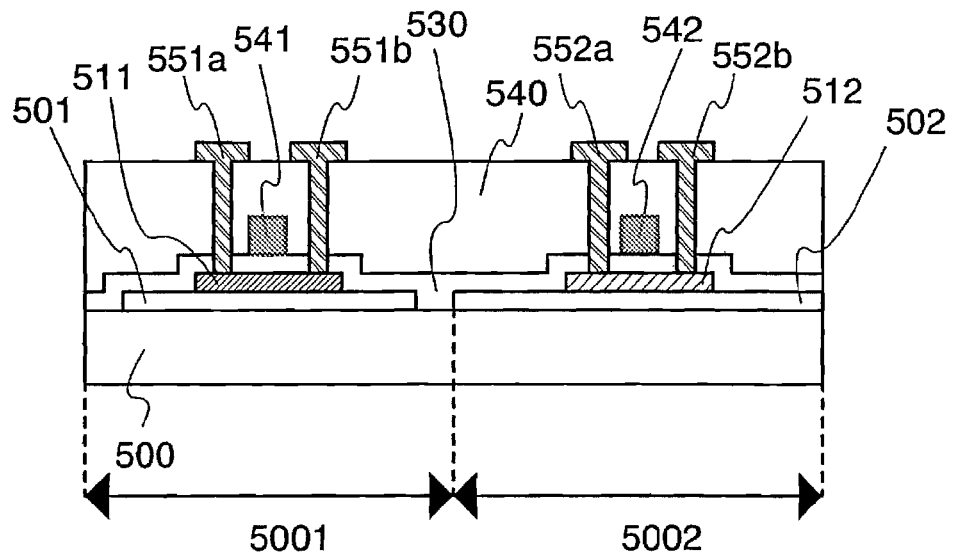

Next, an interlayer insulating film 540 is formed over the separated (cleavage) single-crystal semiconductor layer 511, the non-single-crystal semiconductor layer 512, the gate insulating film 530, the gate electrode 541, and the gate electrode 542. Then, contact holes are formed in the interlayer insulating film 540, and a wiring 551a, a wiring 551b, a wiring 552a, and a wiring 552b are formed (FIG. 11C).

For the interlayer insulating film 540, a silicon nitride film, a silicon oxide film, a silicon nitride oxide film, a silicon oxynitride film, or the like can be used. An organic resin film of acrylic, polyimide, a siloxane polymer, or the like can also be used. The interlayer insulating film may be a single layer or a stacked layer. The thickness of the interlayer insulating film 540 is preferably larger than that of the gate electrode 541.

Heat treatment for activating the impurity element may be performed before or after formation of the interlayer insulating film 540.

For the wiring 551a, the wiring 551b, the wiring 552a, and the wiring 552b, a conductive film of a single layer or a stacked layer using Mo, Cr, Cu, Nd, Al, Al—Nd, Al—Si, Al—Ti, or the like is used. The thicknesses are each preferably from 100 nm to 3 μm.

In the case of manufacturing a display device, a pixel electrode which is connected to any of the wiring 551a, the wiring 551b, the wiring 552a, and the wiring 552b is formed.

Then, a display element is formed.

For example, in the case of a liquid crystal display device, a counter substrate provided with a counter electrode, a color filter, and the like is prepared. Then, alignment films are formed on the counter substrate and the substrate provided with the TFTs. After the substrate provided with the TFTs and the counter substrate are attached to each other with a sealant, liquid crystal is injected between the substrate provided with the TFTs and the counter substrate. In this case, a display element is a part in which the pixel electrode, the liquid crystal, and the counter electrode overlap with one another.

For example, in the case of an EL display device, a layer including a light emitting layer is formed over the pixel electrode and an electrode is formed over the layer including the light emitting layer. Then, a counter substrate is prepared, and the counter substrate and a substrate provided with the TFTs are attached to each other with a sealant. In this case, a display element is a part in which the pixel electrode, the layer including the light emitting layer, and the electrode overlap with one another.

A multilayer wiring in which a plurality of interlayer insulating films and wirings are stacked may be appropriately formed depending on the circuit design.

Embodiment Mode 8

Embodiment Mode 8 will describe a process which involves laser crystallization using a cap film.

The optimal energy density for semiconductor layers in laser beam irradiation varies depending on the thicknesses of the semiconductor layers.

Even when the semiconductor layers have the same thickness, if the materials thereof are different, the optimal energy densities are different.

As the thickness of the semiconductor layer is smaller, the optimal energy density therefor is lower, and as the thickness thereof is larger, the optimal energy density therefor is higher. For example, in the case where the thickness of the semiconductor layer which is formed of silicon is 50 nm, the optimal energy density is from 350 mJ/cm$^2$ to 450 mJ/cm$^2$. In the case of the semiconductor layer which is formed of silicon is 100 nm, the optimal energy density is from 600 mJ/cm$^2$ to 700 mJ/cm$^2$.

To calculate the optimal energy density, evaluation may be performed in advance by a method in which semiconductor samples irradiated with laser beams under different conditions of energy density are prepared and observed using a microscope to evaluate crystallinity, a method in which crystallinity is evaluated using a Raman spectrometer, or a method in which thin film transistors are actually manufactured and evaluated.

By formation of a cap film over a surface of a semiconductor layer, a plurality of semiconductor layers whose optimal energy densities are different from each other can be irradiated all at once with a laser beam.

The cap film may be an anti-reflective film or a reflective film.

In the case of forming an anti-reflective film as a cap film, reflectance is low (absorptance is relatively high) as compared with the case of not forming the cap film.

As the anti-reflective film, a single layer of a silicon oxide film, a silicon nitride film, a silicon nitride oxide film, a silicon oxynitride film, or the like can be used.

On the other hand, in the case of forming a reflective film as a cap film, reflectance is high (absorptance is relatively low) as compared with the case of not forming the cap film.

As the reflective film, a film laminate of plural kinds of films selected from a silicon oxide film, a silicon nitride film, a silicon nitride oxide film, a silicon oxynitride film, and the like can be used.

Here, the cap film is provided to change absorptance, reflectance, and transmittance of a laser beam by changing the optical path length of the laser beam. Note that the absorptance, the reflectance, and the transmittance add up to 1.

An optical path length is the product (ns) of a geometric length (s) through which light travels and the refractive index (n) of a medium through which light travels.

An optical path length can be changed freely by suitably selecting the material of the cap film to control the refractive index (n) and by changing the thickness of the cap film to control the geometric length (s) of regions having different refractive indices.

Further, the energy applied to the semiconductor layer is proportional to the absorptance.

Thus, the optical path length can be changed by determining the material and the thickness of the cap film. Further, absorptance of the laser beam can be changed by changing the optical path length. Moreover, energy applied to the semiconductor layer can be changed by changing the absorptance of the laser beam. Accordingly, the energy applied to the semiconductor layer can be changed by selecting the material and the thickness of the cap film.

Specifically, the optimal energy density tends to be higher as the thickness of the semiconductor layer is larger; therefore, an anti-reflective film may be provided over a semiconductor layer having a larger film thickness.

Alternatively, a reflective film may be provided over a semiconductor layer having a smaller thickness.

Further, in the case where a first semiconductor layer and a second semiconductor layer having larger thickness than the first semiconductor layer are provided; a first cap film is provided over the first semiconductor layer; and a second cap film is provided over the second semiconductor layer, the first cap film preferably has higher absorptance than the second cap film.

Specifically, the separated (cleavage) single-crystal semiconductor layer 511 and the non-single-crystal semiconductor layer 512 are provided over a substrate by the method of Embodiment Mode 4 (FIGS. 6A to 6C, and FIG. 12A).

Figure 12A:
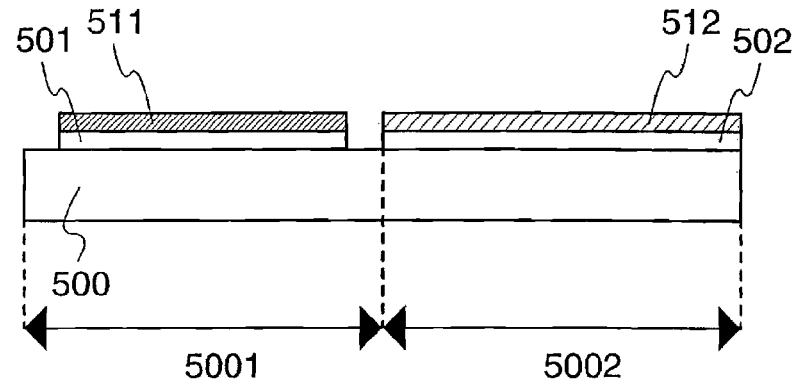
FIGS. 12A to 12C show a manufacturing method of a semiconductor device.
Figure 12B:
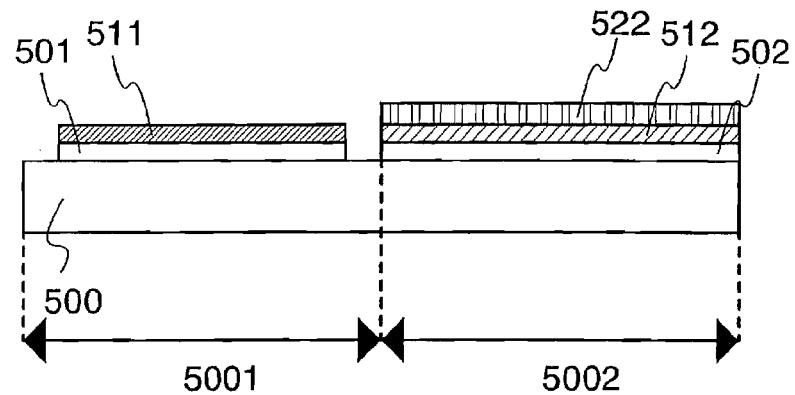

Then, a cap film 522 is provided over the non-single-crystal semiconductor layer 512 (FIG. 12B).

Whether a reflective film or an anti-reflective film is provided may be appropriately selected depending on the material and the thickness of the semiconductor layer.

Figure 12C:
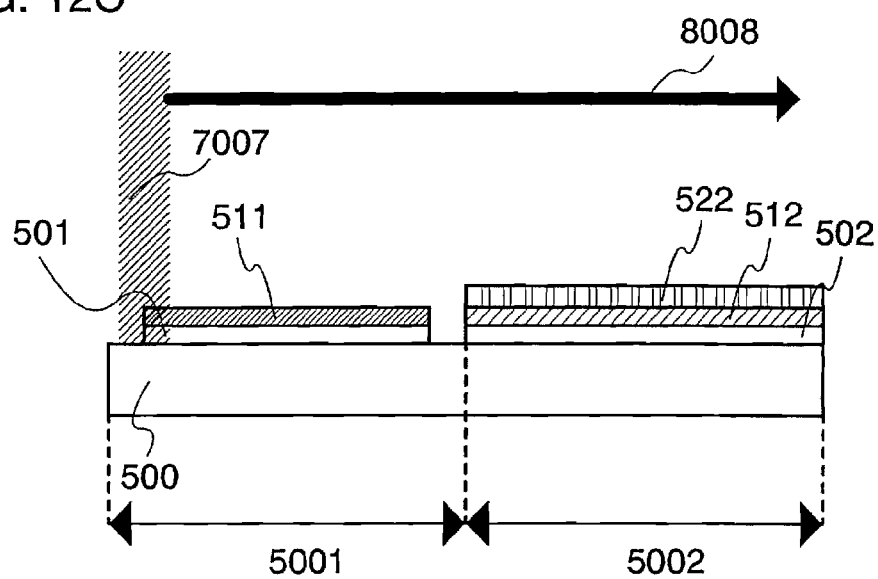

Then, irradiation is performed in an inert atmosphere by scanning the separated (cleavage) single-crystal semiconductor layer 511 and the non-single-crystal semiconductor layer 512 with a laser beam 7007 in a direction indicated by an arrow 8008 (FIG. 12C).

Figure 13A:
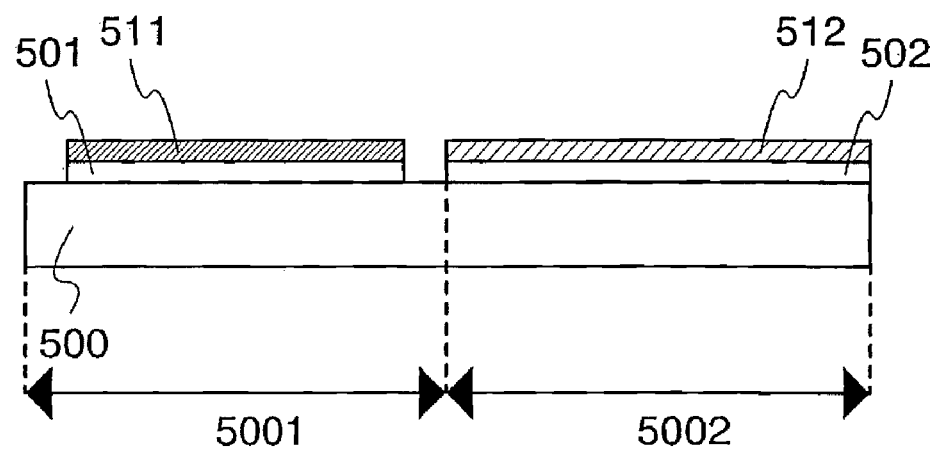
FIGS. 13A and 13B show a manufacturing method of a semiconductor device.

Next, the cap film 522 is removed (FIG. 13A).

Figure 13B:
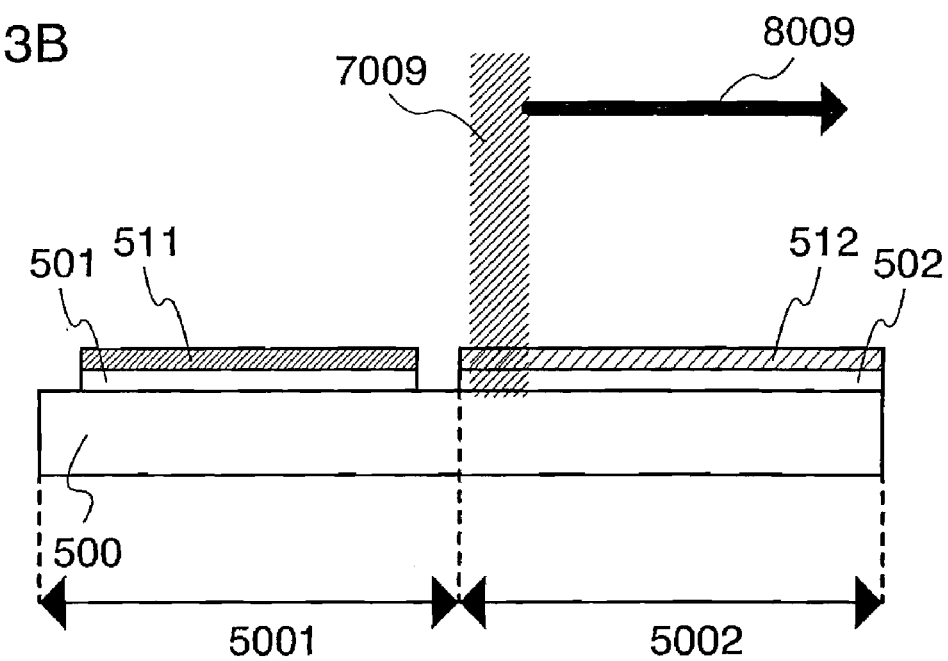

Then, selective irradiation is performed in an air atmosphere by scanning only the non-single-crystal semiconductor layer 512 with a laser beam 7009 in a direction indicated by an arrow 8009 (FIG. 13B).

The scanning directions of the laser beams are not limited to the directions indicated by the arrow 8008 and the arrow 8009. Further, scanning may be performed by moving the laser beam itself or by moving the substrate relative to the laser beam.

By the method of this embodiment mode, characteristics of the non-single-crystal semiconductor layer 512 and flatness and characteristics of the separated (cleavage) single-crystal semiconductor layer 511 can be ensured.

In this case, since the flatness of the non-single-crystal semiconductor layer 512 becomes poor, it is preferable that the thickness of a gate insulating film formed over the non-single-crystal semiconductor layer 512 be larger than that of a gate insulating film formed over the separated (cleavage) single-crystal semiconductor layer 511.

Then, a semiconductor device is completed by a method similar to that of Embodiment Mode 7.

Embodiment Mode 9

In Embodiment Mode 9, surface flatness of a separated (cleavage) single-crystal semiconductor layer and a non-single-crystal semiconductor layer, and characteristics of devices using the separated (cleavage) single-crystal semiconductor layer and the non-single-crystal semiconductor layer will be described.

First, Tables 1 and 2 show flatness of surfaces of the separated (cleavage) single-crystal semiconductor layer and the non-single-crystal semiconductor layer before and after laser irradiation. Regarding Table 1, laser irradiation is performed without using a cap film and flatness before and after the laser irradiation is compared. Regarding Table 2, laser irradiation is performed after forming a cap film, and flatness before and after the laser irradiation is compared.

TABLE 1

Comparison of surface flatness (without cap film)

| | Non-single-crystal semiconductor layer | Separated (cleavage) single-crystal semiconductor layer |
|---|---|---|
| Before laser irradiation | ○ | X |
| After laser irradiation (air atmosphere) | X | X |
| After laser irradiation (inert atmosphere) | ○ | ○ |

X: Not preferable flatness
○: Preferable flatness

TABLE 2

Comparison of surface flatness (with cap film)

| | Non-single-crystal semiconductor layer | Separated (cleavage) single-crystal semiconductor layer |
|---|---|---|
| Before laser irradiation | ○ | X |
| After laser irradiation (air atmosphere) | ○ | X |
| After laser irradiation (inert atmosphere) | ○ | X |

X: Not preferable flatness
○: Preferable flatness

Since the separated (cleavage) single-crystal semiconductor layer is obtained by a method in which separation is caused by creating a crack; therefore, irregularities are formed on the surface and the flatness is not good.

On the other hand, the non-single-crystal semiconductor layer is formed without using the method in which separation is caused by creating a crack; therefore, the non-single-crystal semiconductor layer has less irregularities on the surface as compared with the separated (cleavage) single-crystal semiconductor layer and the flatness is good.

Further, in the case where laser beam irradiation is performed without using a cap film, laser beam irradiation in an air atmosphere makes both the separated (cleavage) single-crystal semiconductor layer and the non-single-crystal semiconductor layer have poor flatness.

On the other hand, also in the case where laser beam irradiation is performed without using a cap film, laser beam irradiation in an inert atmosphere makes both the separated (cleavage) single-crystal semiconductor layer and the non-single-crystal semiconductor layer have good flatness.

An inert atmosphere is an atmosphere in which oxygen concentration is low, for example, a nitrogen atmosphere, a rare gas atmosphere, or the like.

This is because ridges are easily formed on a semiconductor layer surface when it is irradiated with a laser beam in the air atmosphere, due to the effect of oxygen.

Further, when irradiation with a laser beam is performed using a cap film, the flatness is not greatly changed by the laser irradiation either in an air atmosphere or in an inert atmosphere.

Tables 3 and 4 show the crystallinity of the separated (cleavage) single-crystal semiconductor layer and the non-single-crystal semiconductor layer before and after laser irradiation. Regarding Tables 3 and 4, transistors are formed with or without laser irradiation in different atmospheres, and device characteristics are compared. In the case of Table 3, laser irradiation is performed without a cap film while laser irradiation is performed using a cap film in the case of Table 4.

TABLE 3

Comparison of device characteristics (without cap film)

| | Non-single-crystal semiconductor layer | Separated (cleavage) single-crystal semiconductor layer |
|---|---|---|
| Before laser irradiation | 1 | 4 |
| After laser irradiation (air atmosphere) | 3 | 5 |
| After laser irradiation (inert atmosphere) | 2 | 5 |

*Relative evaluation: the larger the number is, the better the device characteristics are.

TABLE 4

Comparison of device characteristics (with cap film)

| | Non-single-crystal semiconductor layer | Separated (cleavage) single-crystal semiconductor layer |
|---|---|---|
| Before laser irradiation | 1 | 4 |
| After laser irradiation (air atmosphere) | 2 | 5 |
| After laser irradiation (inert atmosphere) | 2 | 5 |

*Relative evaluation: the larger the number is, the better the device characteristics are.

Of course, the device using the separated (cleavage) single-crystal semiconductor layer has better characteristics as compared with a device using the non-single-crystal semiconductor layer.

Further, in the case of performing laser beam irradiation without using a cap film, the device characteristics are improved naturally.

Further, laser beam irradiation in an air atmosphere makes oxygen contained in the atmosphere enter the semiconductor layer, so that a large number of dangling bonds created in forming the non-single-crystal semiconductor layer are reduced; thus, device characteristics of a device using the non-single-crystal semiconductor layer are enhanced.

Note that dangling bonds in the separated (cleavage) single-crystal semiconductor layer are few, oxygen contained in the atmosphere in which laser irradiation is performed does not greatly affect the device characteristics.

On the other hand, in the case where laser beam irradiation is performed using a cap film, the surface of the semiconductor is not bare, so that oxygen contained in the atmosphere in which laser irradiation is performed does not greatly affect the device characteristics.

Embodiment Mode 10

In Embodiment Mode 10, a laser irradiation test substrate will be described.

Energy of a laser beam is very unstable, and even when laser beams are applied under the same settings using the same apparatus, energy of the laser beams varies every time due to apparatus condition.

Accordingly, a laser irradiation test substrate formed of the same material and with the same thickness as the semiconductor layer to be irradiated with a laser beam is prepared. Incidentally, when a sample substrate and a laser irradiation test substrate are formed using a manufacturing apparatus of a semiconductor layer, it is generally very difficult to form the sample substrate and the laser irradiation test substrate which have exactly the same thickness of the semiconductor layer. Therefore, the term "the same" here may mean "almost the same". In other words, the laser irradiation test substrate may be formed using a material (film forming gas or a sputtering target) which is used for forming a layer which is the irradiation target so as to have a thickness approximating that of the layer. Accordingly, the laser irradiation test substrate is formed under the same settings using the same apparatus used for forming the layer which is the irradiation target.

Further, after irradiating the laser irradiation test substrate with a laser beam under a plurality of conditions, the plurality of the conditions are evaluated to determine the optimal condition (optimal crystallinity). Then, laser irradiation with a laser beam is performed under the optimal condition (optimal crystallinity).

For example, crystallinity is evaluated by analyzing an image of the laser irradiation test substrate, which is enlarged by a microscope. Further, crystallinity may be evaluated by using a Raman spectrometer.

An example of a method of evaluating the optimal crystallinity will be described (naturally, the evaluation method is not limited to this example). For example, a plurality of sample substrates in each of which a semiconductor film is formed over a substrate is prepared. Then, the plurality of sample substrates are each irradiated with a laser beam having a different energy density. After that, the images of the plurality of semiconductor films or the results of the Raman spectroscopy are obtained. TFTs are manufactured using the plurality of semiconductor films. Values of electrical characteristics of the TFTs are obtained. Further, the values of the electrical characteristics are compared with the images or the results of the Raman spectroscopy. The comparison provides data indicating that a sample substrate with an image or the result of the Raman spectroscopy, which has the most favorable values of the electrical characteristics is the substrate having the optimal crystallinity. Once the data is obtained, crystallinity can be evaluated using the data at anytime thereafter.

Here, when the separated (cleavage) single-crystal semiconductor layer and the non-single-crystal semiconductor layer are irradiated with a laser beam, normally, it is necessary to prepare two laser irradiation test substrates of a separated (cleavage) single-crystal semiconductor layer and a non-single-crystal semiconductor layer.

However, in the case where either the separated (cleavage) single-crystal semiconductor layer or the non-single-crystal semiconductor layer is provided with a cap film and they are irradiated with a laser beam all at once, a laser irradiation test substrate of either the separated (cleavage) single-crystal semiconductor layer or the non-single-crystal semiconductor layer should be prepared.

Therefore, with the use of a cap film, the number of laser irradiation test substrates can be reduced, which can reduce cost.

In particular, since a separated (cleavage) single-crystal semiconductor layer is expensive as compared with a non-single-crystal semiconductor layer; therefore, it is preferable to use a non-single-crystal semiconductor layer as a laser irradiation test substrate.

Note that a laser irradiation test substrate is preferably processed under the same conditions as the substrate to be processed. Therefore, the laser irradiation test substrate of a semiconductor layer in a region provided with a cap film is preferably a semiconductor layer provided with a cap film on its surface.

Embodiment Mode 11

In the case of forming a display device or a contactless tag, it is preferable that a photo IC be formed together with the display device or the contactless tag, over the same substrate.

For example, a thin film transistor for a circuit of a display device and a thin film transistor for a circuit of a photo IC are formed together.

In this case, using a non-single-crystal semiconductor layer for the circuit of the photo IC is preferable in terms of cost. On the other hand, using a separated (cleavage) single-crystal semiconductor layer for the circuit of the photo IC is preferable since an accurate sensing function can be fulfilled.

In the case of providing a display device and a photo IC over the same substrate, the photo IC can be used as a "brightness sensor".

The "brightness sensor" has a function of automatically adjusting the brightness of a backlight or an electroluminescent display element in accordance with the brightness of a room. Accordingly, wasteful power consumption can be suppressed and the energy can be saved, which is preferable.

In the case of applying brightness sensors to an electroluminescent display device, one brightness sensor is preferably formed for one pixel so that light adjustment can be conducted per pixel.

Note that any of the display devices described in another embodiment mode can be used as the display device.

Alternatively, for example, a thin film transistor for a circuit of a contactless tag and a thin film transistor for a circuit of a photo IC are formed together.

In this case, using a non-single-crystal semiconductor layer for the circuit of the photo IC is preferable in terms of cost. On the other hand, using a separated (cleavage) single-crystal semiconductor layer for the circuit of the photo IC is preferable since an accurate sensing function can be fulfilled.

It is preferable to provide a contactless tag and a photo IC over the same substrate since both wireless detection and light detection can be conducted.

A photo IC is formed by selectively forming a PIN-type semiconductor layer over wirings (such as the wiring 551a, the wiring 551b, the wiring 552a, and the wiring 552b) of thin film transistors. The semiconductor layer may be obtained by selectively etching a semiconductor film formed by a CVD method or the like.

Then, a protective film (e.g., an epoxy resin or the like) is selectively formed by a printing method or the like over the PIN-type semiconductor layer. Note that the protective film is formed so as to have a contact hole which reaches the PIN-type semiconductor layer.

Next, a wiring which connects to the PIN-type semiconductor layer through the contact hole is formed by a printing method, a sputtering method, or the like. In the printing method, a nickel paste, a copper paste, or the like can be used as a wiring material. In the sputtering method, nickel, copper, or the like can be used as a wiring material.

Through the above-described process, a photo IC can be formed.

Embodiment Mode 12

In Embodiment Mode 12, examples of semiconductor devices of the present invention will be described.

The present invention can be applied to a pixel area, a driver circuit area, or the like of a display device provided with an organic light-emitting element, an inorganic light-emitting element, a liquid crystal display element, or the like.

Further, an electronic device provided with a memory medium, such as a digital camera, a car navigation system, a notebook computer, a game machine, a portable information terminal (e.g., a mobile telephone or a portable game machine), or a home game machine, can be manufactured using the present invention.

Furthermore, the present invention can be applied to an integrated circuit such as a CPU (central processing unit).

Figure 14A:
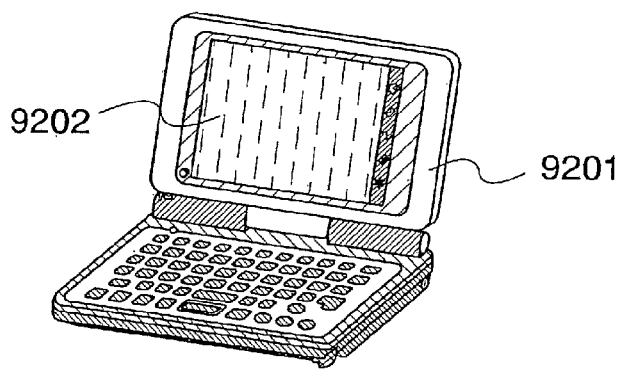
FIGS. 14A to 14E show examples of a semiconductor device.
Figure 14B:
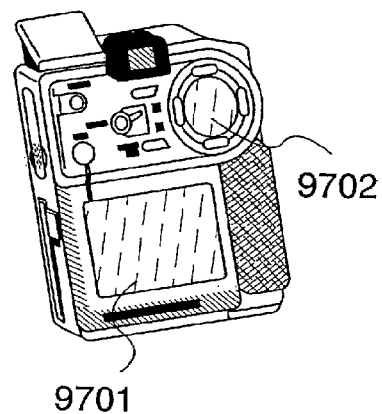
Figure 14C:
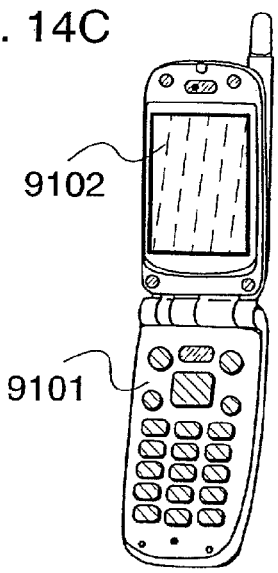
Figure 14D:
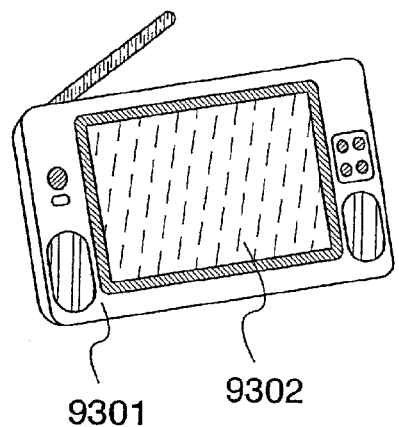
Figure 14E:
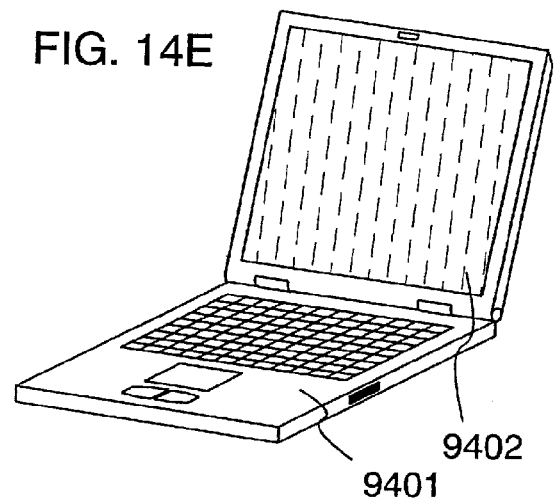

For example, FIG. 14A shows a portable information terminal. FIG. 14B shows a digital camera. FIG. 14C shows a mobile telephone. FIG. 14D shows a car navigation system. FIG. 14E shows a notebook computer. The present invention can be applied to an integrated circuit incorporated in a main body 9201, 9702, 9101, 9301 and 9401, or a display portion 9202, 9701, 9102, 9302 and 9402 of each of the devices.

Embodiment 1

Figure 15:
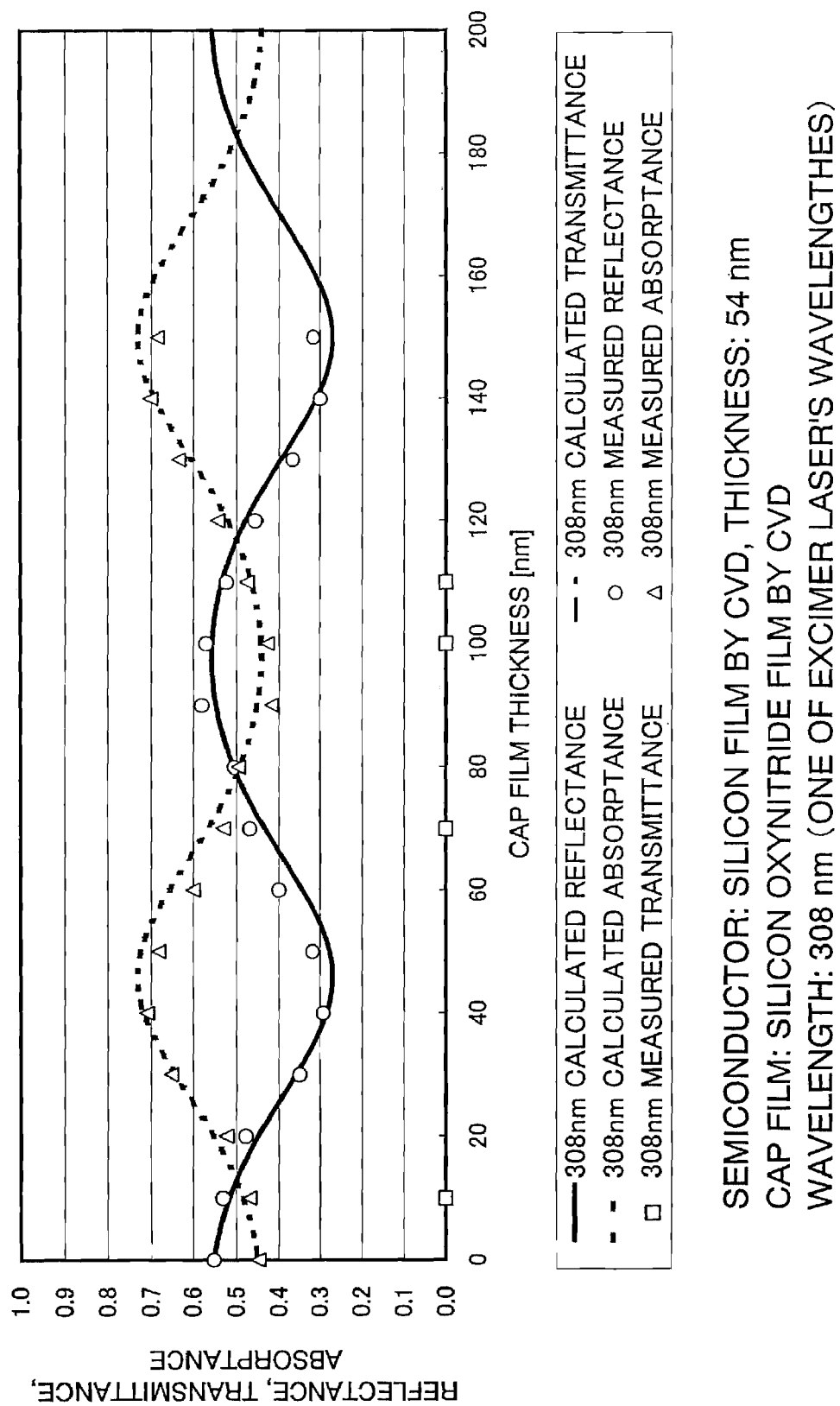
FIG. 15 shows reflectance, absorptance, and transmittance of an anti-reflective film.
Figure 16:
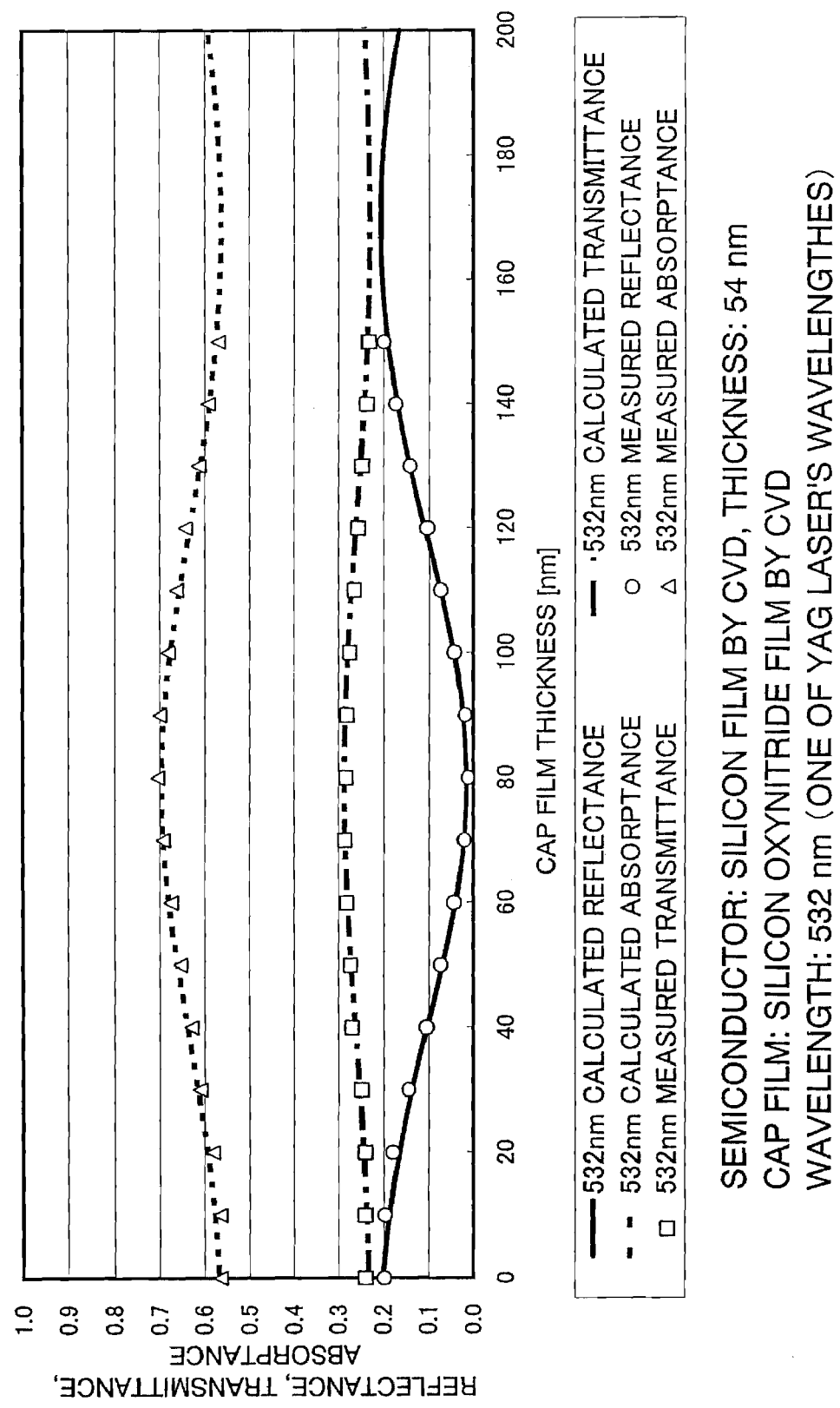
FIG. 16 shows reflectance, absorptance, and transmittance of an anti-reflective film.

FIG. 15 and FIG. 16 each show the reflectance, the absorptance, and the transmittance of cap films with varying thickness, which are irradiated with laser beams having a wavelength of 308 nm and a wave length of 532 nm, respectively.

Each graph of FIG. 15 and FIG. 16 shows a plot of the dependency of the reflectance, absorptance, and transmittance on the thickness of a cap film in the case where a plurality of samples were prepared, in each of which a silicon nitride oxide film (thickness: 50 nm), a silicon oxynitride film (thickness: 100 nm), and an amorphous silicon film (thickness: 54 nm) were sequentially formed over a 1737 substrate (manufactured by Corning Inc.) by CVD, and a silicon oxynitride film having a different thickness was formed as a cap film by CVD over the amorphous silicon film.

A spectrophotometer (U-4000 SPECTROPHOTOMETER manufactured by HITACHI) was used as a measurement device.

As shown in FIG. 15 and FIG. 16, the absorptance in a state where a cap film is formed as a single layer is higher as compared with the absorptance in a state where the film thickness is 0 nm, that is, a cap film is not formed.

Accordingly, when a cap film is formed as a single layer, the reflectance is low; therefore, the cap film can serve as an anti-reflective film.

Embodiment 2

Figure 17:
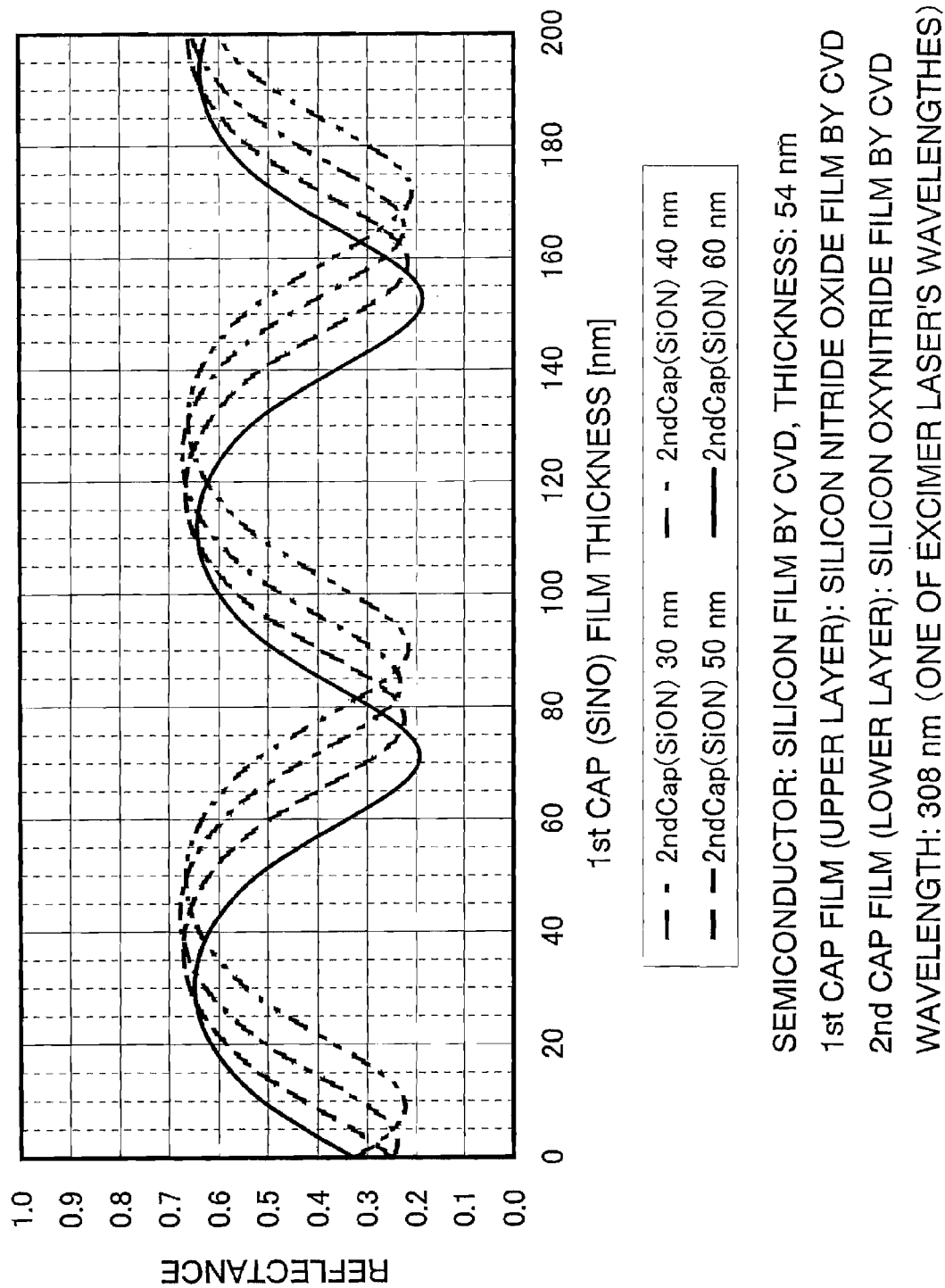
FIG. 17 shows reflectance of reflective films.

FIG. 17 shows the reflectance of cap films with varied thickness, each of which is irradiated with a laser beam having a wavelength of 308 nm.

FIG. 17 shows a plot of the dependency of the reflectance on the thickness of a cap film in the case where a plurality of samples were prepared, in each of which a silicon nitride oxide film (thickness: 50 nm), a silicon oxynitride film (thickness: 100 nm), and an amorphous silicon film (thickness: 54 nm) were sequentially formed over a 1737 substrate (manufactured by Corning Inc.) by CVD, and a stack of a silicon nitride oxide film ($1^{st}$ Cap) and a silicon oxynitride film ($2^{nd}$ Cap), which has different thickness, was formed as a cap film by CVD over the amorphous silicon film.

A spectrophotometer (U-4000 SPECTROPHOTOMETER manufactured by HITACHI) was used as a measurement device.

In FIG. 17, the reflectance is higher than the state where a cap film is not formed (FIG. 15: the reflectance with respect to the thickness of 0 nm) under some conditions.

This indicates that there are some conditions under which a stack of cap films can be used as a reflective film.

Embodiment 3

Laser beam irradiation is performed by a method described in Embodiment Mode 4.

The thickness of the separated (cleavage) single-crystal semiconductor layer 511 formed in the first region 5001 is 100 nm, and the thickness of the non-single-crystal semiconductor layer 512 formed in the second region 5002 is 50 nm.

In this case, the optimal energy density with respect to the film thickness of 100 nm is 600 mJ/cm$^2$ to 700 mJ/cm$^2$. Meanwhile, the optimal energy density with respect to the film thickness of 50 nm is 350 mJ/cm$^2$ to 450 mJ/cm$^2$. Accordingly, when the separated (cleavage) single-crystal semiconductor layer 511 and the non-single-crystal semiconductor layer 512 are irradiated with a laser beam all at once, in order to irradiate each of them with the optimal energy density, the separated (cleavage) single-crystal semiconductor layer 511 having a thickness of 100 nm should be irradiated with a laser beam having an energy density which is 1.5 to 2 times the energy density of a laser beam with which the non-single-crystal semiconductor layer 512 having a thickness of 50 nm is irradiated. Here, the material of the cap films, the thickness of the cap films, and the energy density of the laser beam are selected so that both of them are irradiated at an energy density of 1.75 times the energy density of a laser beam with which the non-single-crystal semiconductor layer 512 having a thickness of 50 nm is irradiated.

Then, a cap film is formed with a silicon oxynitride film having a thickness of 40 nm over the non-single-crystal semiconductor layer 512 with reference to the graph in FIG. 15.

Next, laser irradiation is performed with an excimer laser beam having a wavelength of 308 nm under a condition of the energy density of a laser irradiation apparatus to be 1000 mJ/cm$^2$.

The separated (cleavage) single-crystal semiconductor layer 511 which is not provided with a cap film has an absorptance of about 0.4. Accordingly, the separated (cleavage) single-crystal semiconductor layer 511 absorbed energy of about 400 mJ per square centimeter.

On the other hand, the non-single-crystal semiconductor layer 512 provided with a cap film having a thickness of 40 nm has an absorptance of about 0.7. Accordingly, the non-single-crystal semiconductor layer 512 absorbed energy of about 700 mJ per square centimeter.

As described above, with the use of a cap film, energy to be absorbed in each of the separated (cleavage) single-crystal semiconductor layer 511 and the non-single-crystal semiconductor layer 512 was adjusted.

Embodiment 4

In Embodiment 4, the results of evaluating flatness of surfaces of semiconductor layers using an atomic force microscope (AFM) after irradiating the semiconductor layers with a laser beam in different atmospheres will be described.

Two substrates were prepared, in each of which a silicon nitride oxide film (thickness: 50 nm), a silicon oxynitride film (thickness: 100 nm), and an amorphous silicon film (thickness: 54 nm) were sequentially formed over a 1737 substrate (manufactured by Corning Inc.) by CVD.

Further, heat treatment was performed at 500° C. for one hour, and thereby hydrogen in the semiconductor was released.

After that, one of the substrates is irradiated with a laser beam in the air atmosphere without providing a cap film, and the other of the substrates is irradiated with a laser beam in a nitrogen atmosphere without providing a cap film.

The laser irradiation was performed using an excimer laser which emits a laser beam having a wavelength of 308 nm.

After that, the surface flatness of the semiconductor layer was evaluated using the atomic force microscope. The evaluation results are shown in Table 5.

TABLE 5

Atmospheric dependency of surface flatness

|  | Air atmosphere | Inert atmosphere |
| --- | --- | --- |
| Mean surface roughness (Ra) | 91.32 nm | 32.49 nm |
| Maximum peak-to-valley height (P-V) | 10.49 nm | 2.64 nm |
| Root mean square roughness (Rms) | 12.97 mn | 3.37 nm |

The semiconductor layer irradiated with a laser beam in a nitrogen atmosphere was smaller in all of mean surface roughness (Ra), maximum peak-to-valley height (P-V), and root mean square roughness (Rms), and it had superior flatness.

Further, in all experiments conducted several times under the similar conditions, semiconductor layers each irradiated with a laser beam in a nitrogen atmosphere exhibited lower values.

This mechanism is not clear but the present inventor considers that oxygen has an effect on the crystal growth mechanism, thereby influencing the surface morphology.

Embodiment 5

AN100 substrates (manufactured by Asahi Glass Co., Ltd.) were prepared.

Then, a silicon nitride oxide film (thickness: 50 nm) was formed over each substrate by plasma CVD using silane (SiH$_4$), dinitrogen oxide (N$_2$O), ammonia (NH$_3$), and hydrogen (H$_2$) as a film forming gas.

A silicon oxynitride film (thickness: 100 nm) was formed over each silicon nitride oxide film by plasma CVD using silane and dinitrogen oxide as a film forming gas.

Further, an amorphous silicon film (54 nm) was formed over each silicon oxynitride film by plasma CVD using silane as a film forming gas.

Then, hydrogen in the semiconductor was released by performing heat treatment at 500° C. for one hour.

After that, one of the substrates was irradiated with a laser beam in the air atmosphere, and the other was irradiated with a laser beam in a nitrogen atmosphere.

Note that a cap film is not provided for either of them.

The laser beam irradiation was performed using an excimer laser which emits a laser beam having a wavelength of 308 nm.

After that, after processing each of the silicon films into an island shape, a gate insulating film (thickness: 115 nm) was formed of silicon oxynitride by plasma CVD using silane and dinitrogen oxide as a film forming gas. Next, the gate insulating film was subjected to cleaning treatment including HF treatment. The cleaning treatment reduced the thickness of the gate insulating film by approximately 5 nm. Then, a gate electrode (an electrode in which tungsten (370 nm) is stacked on tantalum nitride (30 nm)) was formed on the gate insulating film.

After that, phosphorus or boron was added to the semiconductor layers by ion doping to form LDD regions, source regions, and drain regions, and thereby an n-type transistor and a p-type transistor were formed over each of the substrates.

Next, interlayer insulating films in each of which a first silicon oxide film (50 nm), a silicon nitride film (100 nm), and a second silicon oxide film (600 nm) were stacked in this order were formed by plasma CVD.

Then, heat treatment was performed at a temperature of 410° C. for one hour.

Then, contact holes were provided in the interlayer insulating films.

Then, pad portions and wirings in which titanium, titanium nitride, aluminum, and titanium were sequentially stacked were formed.

After that, a probe needle was contacted with the pad portions to measure electrical characteristics of the transistors in each region of each substrate.

The measurement results are shown below.

TABLE 6

Atmospheric dependency of device characteristics
(n-channel transistors)

|  | Air atmosphere | Inert atmosphere |
| --- | --- | --- |
| Threshold voltage (V) | 1.60 | 2.71 |
| S-value (V/dec) | 0.21 | 0.29 |
| Field effect mobility (cm$^2$/Vs) | 92.90 | 35.96 |

TABLE 7

Atmospheric dependency of device characteristics
(p-channel transistors)

|  | Air atmosphere | Inert atmosphere |
|---|---|---|
| Threshold voltage (V) | −1.66 | −4.10 |
| S-value (V/dec) | 0.25 | 0.37 |
| Field effect mobility (cm$^2$/Vs) | 64.99 | 38.24 |

Table 6 shows the average of 50 n-channel transistors, and Table 7 shows the average of 50 p-channel transistors.

Power consumption is higher as the absolute value of the threshold voltage is higher; therefore, better characteristics can be achieved when the absolute value is lower.

An S-value (also referred to as a subthreshold swing) is an index of switching characteristics of transistors, and the switching characteristics are better when the S-value is smaller.

A field effect mobility is an index of the speed of carrier movement, and the characteristics are better when the field effect mobility is higher.

Here, as shown in Table 6 and Table 7, the electrical characteristics of both the n-channel transistors and the p-channel transistors were favorable when the laser beam irradiation was performed in the air atmosphere.

The reason that the electrical characteristics of both the n-channel transistors and the p-channel transistors were favorable when the laser beam irradiation was performed in the air atmosphere is not clear. However, the present inventor considers that the reason is that defects of a large number of dangling bonds created at the time of forming the amorphous silicon films are compensated by oxygen contained in the laser irradiation atmosphere.

This application is based on Japanese Patent Application serial No. 2007-146540 filed with Japan Patent Office on Jun. 1, 2007, the entire contents of which are hereby incorporated by reference.

What is claimed is:

1. A manufacturing method of a semiconductor device comprising:
   forming a non-single-crystal semiconductor film over a substrate;
   removing a part of the non-single-crystal semiconductor film, which is in a first region over the substrate, to form a non-single-crystal semiconductor layer in a second region over the substrate;
   introducing ion species into a single-crystal semiconductor substrate to form an ion layer at a predetermined depth from a surface of the single-crystal semiconductor substrate;
   forming a bonding layer over the surface of the single-crystal semiconductor substrate;
   bonding the bonding layer to the first region over the substrate;
   applying an energy to the single-crystal semiconductor substrate to generate a crack in the ion layer so that a single-crystal semiconductor layer remains in the first region over the substrate;
   irradiating the non-single-crystal semiconductor layer with a first laser beam in an air atmosphere; and
   irradiating the non-single-crystal semiconductor layer and the single-crystal semiconductor layer with a second laser beam in an inert atmosphere.

2. The manufacturing method of a semiconductor device according to claim 1, wherein a driver circuit is formed in the first region and a pixel area including liquid crystal display elements is formed in the second region.

3. The manufacturing method of a semiconductor device according to claim 1, wherein a pixel area including electroluminescent display elements is formed in the first region and a driver circuit is formed in the second region.

4. The manufacturing method of a semiconductor device according to claim 1, wherein an analog circuit is formed in the first region and a digital circuit is formed in the second region.

5. The manufacturing method of a semiconductor device according to claim 1, wherein the introducing step is conducted by an implantation or doping.

6. The manufacturing method of a semiconductor device according to claim 1, wherein the semiconductor device is one selected from the group consisting of a portable information terminal, a camera, a telephone, a navigation system, and a computer.

7. A manufacturing method of a semiconductor device comprising:
   forming a non-single-crystal semiconductor film over a substrate;
   irradiating the non-single-crystal semiconductor film with a first laser beam in an air atmosphere;
   removing a part of the non-single-crystal semiconductor film, which is in a first region over the substrate, to form a non-single-crystal semiconductor layer in a second region over the substrate;
   introducing ion species into a single-crystal semiconductor substrate to form an ion layer at a predetermined depth from a surface of the single-crystal semiconductor substrate;
   forming a bonding layer over the surface of the single-crystal semiconductor substrate;
   bonding the bonding layer to the first region over the substrate;
   applying an energy to the single-crystal semiconductor substrate to generate a crack in the ion layer so that a single-crystal semiconductor layer remains in the first region over the substrate; and
   irradiating the non-single-crystal semiconductor layer and the single-crystal semiconductor layer with a second laser beam in an inert atmosphere.

8. The manufacturing method of a semiconductor device according to claim 7, wherein a driver circuit is formed in the first region and a pixel area including liquid crystal display elements is formed in the second region.

9. The manufacturing method of a semiconductor device according to claim 7, wherein a pixel area including electroluminescent display elements is formed in the first region and a driver circuit is formed in the second region.

10. The manufacturing method of a semiconductor device according to claim 7, wherein an analog circuit is formed in the first region and a digital circuit is formed in the second region.

11. The manufacturing method of a semiconductor device according to claim 7, wherein the introducing step is conducted by an implantation or doping.

12. The manufacturing method of a semiconductor device according to claim 7, wherein the semiconductor device is one selected from the group consisting of a portable information terminal, a camera, a telephone, a navigation system, and a computer.

13. A manufacturing method of a semiconductor device comprising:
   forming a non-single-crystal semiconductor film over a substrate;

removing a part of the non-single-crystal semiconductor film, which is in a first region over the substrate, to form a non-single-crystal semiconductor layer in a second region over the substrate;
introducing ion species into a single-crystal semiconductor substrate to form an ion layer at a predetermined depth from a surface of the single-crystal semiconductor substrate;
forming a bonding layer over the surface of the single-crystal semiconductor substrate;
bonding the bonding layer to the first region over the substrate;
applying an energy to the single-crystal semiconductor substrate to generate a crack in the ion layer so that a single-crystal semiconductor layer remains in the first region over the substrate;
forming a cap film over the non-single-crystal semiconductor layer;
irradiating the non-single-crystal semiconductor layer and the single-crystal semiconductor layer with a first laser beam in an inert atmosphere after forming the cap film;
removing the cap film; and
irradiating the non-single-crystal semiconductor layer with a second laser beam in an air atmosphere after removing the cap film.

14. The manufacturing method of a semiconductor device according to claim 13, wherein an energy density of the first laser beam is set under an optimal condition determined using a laser irradiation test substrate formed from a non-single-crystal semiconductor.

15. The manufacturing method of a semiconductor device according to claim 13, wherein a driver circuit is formed in the first region and a pixel area including liquid crystal display elements is formed in the second region.

16. The manufacturing method of a semiconductor device according to claim 13, wherein a pixel area including electroluminescent display elements is formed in the first region and a driver circuit is formed in the second region.

17. The manufacturing method of a semiconductor device according to claim 13, wherein an analog circuit is formed in the first region and a digital circuit is formed in the second region.

18. The manufacturing method of a semiconductor device according to claim 13, wherein the introducing step is conducted by an implantation or doping.

19. The manufacturing method of a semiconductor device according to claim 13, wherein the semiconductor device is one selected from the group consisting of a portable information terminal, a camera, a telephone, a navigation system, and a computer.

* * * * *